United States Patent
Oh et al.

(10) Patent No.: US 10,473,716 B2
(45) Date of Patent: Nov. 12, 2019

(54) LEAKAGE CURRENT MEASUREMENT CIRCUIT, INTEGRATED CIRCUIT AND SYSTEM INCLUDING SAME

(71) Applicant: SAMSUNG ELECTRONICS CO., LTD., Suwon-si (KR)

(72) Inventors: Ghil-Geun Oh, Hwaseong-si (KR); Yeon-Joong Shin, Seoul (KR); Da-Rae Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/859,867

(22) Filed: Jan. 2, 2018

(65) Prior Publication Data
US 2018/0356462 A1   Dec. 13, 2018

(30) Foreign Application Priority Data
Jun. 7, 2017   (KR) .......................... 10-2017-0070590

(51) Int. Cl.
| | | |
|---|---|---|
| G01R 31/08 | (2006.01) | |
| G01R 31/02 | (2006.01) | |
| H02H 7/00 | (2006.01) | |
| G01R 31/30 | (2006.01) | |

(52) U.S. Cl.
CPC ................................. *G01R 31/3008* (2013.01)

(58) Field of Classification Search
CPC .................................................. G01R 31/3008
USPC .................................................... 324/750.3
See application file for complete search history.

(56) References Cited

U.S. PATENT DOCUMENTS

| | | |
|---|---|---|
| 6,011,403 A | 1/2000 | Gillette |
| 7,038,483 B1 | 5/2006 | Suzuki et al. |
| 7,193,427 B2 | 3/2007 | Persun et al. |
| 7,411,409 B2 | 8/2008 | Klass et al. |
| 7,705,656 B2 | 4/2010 | Jung |
| 7,825,652 B2 | 11/2010 | Miller |

(Continued)

FOREIGN PATENT DOCUMENTS

| | | |
|---|---|---|
| JP | 2014-48046 A | 3/2014 |
| KR | 10-0672142 B1 | 1/2007 |

OTHER PUBLICATIONS

Chris H. Kim et al., "A Process Variation Compensating Technique With an On-Die Leakage Current Sensor for Nanometer Scale Dynamic Circuits", IEEE Transactions on Very Large Scale Integration (VLSI) Systems, Jun. 2006, pp. 646-649, vol. 14, No. 6.

(Continued)

*Primary Examiner* — Christopher P McAndrew
*Assistant Examiner* — Zannatul Ferdous
(74) *Attorney, Agent, or Firm* — Sughrue Mion, PLLC

(57) ABSTRACT

A leakage current measurement circuit is provided. The leakage current measurement circuit includes a leakage generation circuit and a detection circuit. The leakage generation circuit generates a leakage current from a start time point and generates a leakage voltage signal having a voltage level that changes from an initial voltage based on the leakage current. The detection circuit generates a detection signal having an activation time, the detection signal being generated from the start time point to a detection time point, and the detection time point corresponding to when the voltage level of the leakage voltage signal reaches a target voltage.

19 Claims, 24 Drawing Sheets

(56) References Cited

U.S. PATENT DOCUMENTS

| | | | | |
|---|---|---|---|---|
| 7,835,198 | B2 | 11/2010 | Choi et al. | |
| 7,915,932 | B2* | 3/2011 | Yamashita | G01R 31/275 327/147 |
| 8,174,282 | B2* | 5/2012 | Fujii | G01R 31/2621 257/48 |
| 8,310,269 | B2 | 11/2012 | Bhushan et al. | |
| 9,041,407 | B2* | 5/2015 | Terada | G01R 31/2621 324/509 |
| 2006/0049850 | A1* | 3/2006 | Chu | H03K 19/0963 326/98 |
| 2007/0025030 | A1* | 2/2007 | Jung | G01R 31/275 361/1 |
| 2007/0145981 | A1* | 6/2007 | Tomita | G01R 31/3008 324/509 |
| 2013/0008935 | A1* | 1/2013 | Brusaw | B27F 7/19 227/4 |
| 2016/0018454 | A1* | 1/2016 | Jeon | G11C 29/025 324/509 |
| 2017/0063075 | A1* | 3/2017 | Takeuchi | H02H 3/16 |

OTHER PUBLICATIONS

Yesung Kang et al., "A Wide-Range On-Chip Leakage Sensor Using a Current-Frequency Converting Technique in 65-nm Technology Node", IEEE Transactions on Circuits and Systems—II: Express Briefs, Sep. 2015, pp. 846-850, vol. 62, No. 9.

A. K. M. Mahfuzul Islam et al., "Wide-Supply-Range All-Digital Leakage Variation Sensor for On-Chip Process and Temperature Monitoring", IEEE Journal of Solid-State Circuits, Nov. 2015, pp. 2475-2490, vol. 50, No. 11.

* cited by examiner

| OPERATION MODE | EN | SEL | OPERATION |
|---|---|---|---|
| MDN | L | L | CHARGE TO VDD |
| | H | L | DISCHARGE VIA TNT |
| MDP | H | H | DISCHARGE TO VSS |
| | L | H | CHARE VIA TPT |

LEAKAGE CURRENT MEASUREMENT CIRCUIT, INTEGRATED CIRCUIT AND SYSTEM INCLUDING SAME

CROSS-REFERENCE TO RELATED APPLICATION

This application claims priority from Korean Patent Application No. 10-2017-0070590, filed on Jun. 7, 2017 in the Korean Intellectual Property Office (KIPO), the disclosure of which is incorporated herein by reference in its entirety.

BACKGROUND

1. Field

Methods and apparatuses consistent with example embodiments relate generally to semiconductor integrated circuits, and more particularly to a leakage current measurement circuit, integrated circuit and system including the leakage current measurement circuit.

2. Related Art

As semiconductor devices become increasingly integrated, power consumption by a leakage current in the semiconductor device increases and information on the leakage current becomes important. In general, a system on chip (SoC) includes transistors having various threshold voltages for high speed operation. and The leakage currents of these transistors vary with large deviations depending on the threshold voltages. A power management scheme, such as dynamic voltage and frequency scaling (DVFS), is indispensable in an SoC and information on the exact leakage currents is required for efficient power management. For example, a leakage current may be measured based on a delay of a circuit operation due to the leakage current or using amplification of the leakage current. However, these methods may not be suitable for an SoC because of excessive test time and test circuit area for measuring the leakage current.

SUMMARY

One or more example embodiments provide a leakage current measurement circuit capable of measuring a leakage current of a semiconductor component efficiently.

One or more example embodiments provide an integrated circuit and a system including a leakage current measurement circuit capable of measuring a leakage current of a semiconductor component efficiently.

According to an aspect of an example embodiment, there is provided a leakage current measurement circuit including: a leakage generation circuit configured to generate a leakage current from a start time point and generate a leakage voltage signal having a voltage level that changes from an initial voltage based on the leakage current; and a detection circuit configured to generate a detection signal having an activation time, the detection signal being generated from the start time point to a detection time point, and the detection time point corresponding to when the voltage level of the leakage voltage signal reaches a target voltage.

According to an aspect of another example embodiment, there is provided a system including: a semiconductor wafer including a plurality of semiconductor dies and a leakage current measurement circuit that is formed at a scribe lane for separating the plurality of semiconductor dies; and a test device configured to test the semiconductor wafer. The leakage current measurement circuit includes: a leakage generation circuit configured to generate a leakage current from a start time point and generate a leakage voltage signal having a voltage level that changes from an initial voltage based on the leakage current; and a detection circuit configured to generate a detection signal having an activation time, the detection signal being generated from the start time point to a detection time point, and the detection time point corresponding to when the voltage level of the leakage voltage signal reaches a target voltage.

According to an aspect of yet another example embodiment, there is provided an integrated circuit formed in a semiconductor die, the integrated circuit including: a leakage current measurement circuit configured to measure a leakage current of the semiconductor die; and a monitoring circuit configured to monitor an operation of the integrated circuit based on an output of the leakage current measurement circuit. The leakage current measurement circuit includes: a leakage generation circuit configured to generate the leakage current from a start time point and generate a leakage voltage signal having a voltage level that changes from an initial voltage based on the leakage current; and a detection circuit configured to generate a detection signal having an activation time, the detection signal being generated from the start time point to a detection time point, and the detection time point corresponding to when the voltage level of the leakage voltage signal reaches a target voltage.

BRIEF DESCRIPTION OF THE DRAWINGS

Example embodiments will be more clearly understood from the following detailed description taken in conjunction with the accompanying drawings.

DETAILED DESCRIPTION OF EXAMPLE EMBODIMENTS

Figure 1:
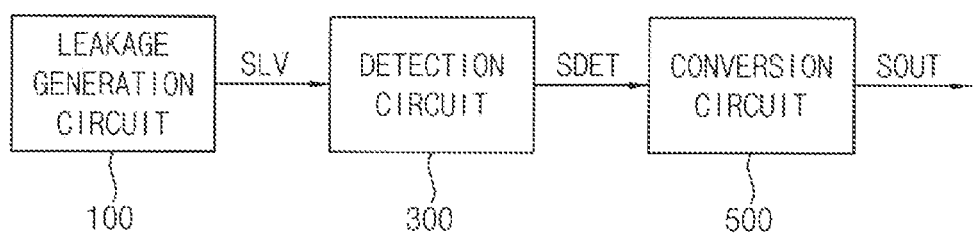
FIG. 1 is a block diagram illustrating a leakage current measurement circuit according to one or more example embodiments.

Example embodiments will now be described with reference to the accompanying drawings. In the drawings, like numerals refer to like elements throughout.

Aspects of example embodiments are described and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the present disclosure.

Figure 2:
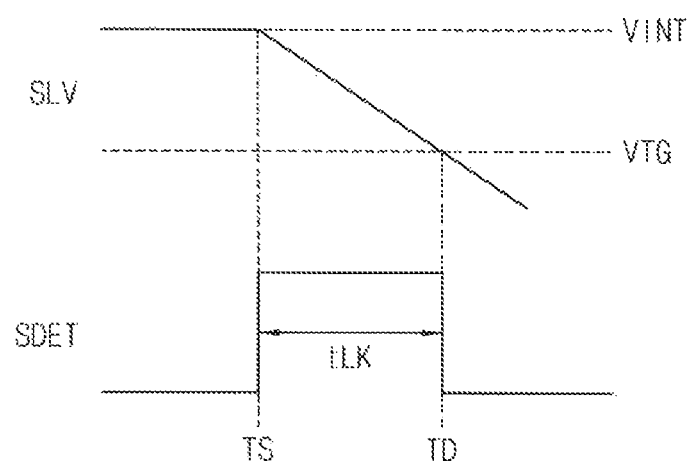
FIG. 2 is a diagram for describing an operation of the leakage current measurement circuit of FIG. 1 according to one or more example embodiments.

FIG. 1 is a block diagram illustrating a leakage current measurement circuit according to one or more example embodiments, and FIG. 2 is a diagram for describing an operation of the leakage current measurement circuit of FIG. 1 according to one or more example embodiments.

Referring to FIGS. 1 and 2, a leakage current measurement circuit 10 may include a leakage generation circuit 100 and a detection circuit 300.

The leakage generation circuit 100 may generate a leakage current internally from a start time point TS and generate a leakage voltage signal SLV having a voltage level that increases or decreases from an initial voltage VINT depending on the leakage current. The detection circuit 300 may generate a detection signal SDET having an activation time tLK from the start time point TS to a detection time point TD at which the voltage level of the leakage voltage signal SLV reaches a target voltage VTG. Although FIG. 2 illustrates a case that the voltage level of the leakage voltage signal SLV decreases form the initial voltage VINT to the target voltage VTG, the voltage level of the leakage voltage signal SLV may increase from the initial voltage VINT to the target voltage VTG according to other example embodiments or operation modes. In addition, although FIG. 2 illustrates a case that the detection signal SDET is activated to a logic high level, the detection signal SDET may be activated to a logic low level according to a circuit configuration.

The leakage current may be measured based on a delay of a circuit operation due to the leakage current or using amplification of the leakage current. However, these methods may not be suitable for an SoC because of excessive test time and test circuit area for measuring the leakage current.

As will be described below, the voltage level of the leakage voltage signal SLV may be increased or decreased by charging or discharging the tracking node, which provides the leakage voltage signal SLV, by the leakage current, and the speed of increase or decrease in the voltage level of the leakage voltage signal SLV may be represented as the activation time tLK of the detection signal SDET. As such, the leakage current measurement circuit according to one or more example embodiments may reduce a test time for leakage current measurement using temporal information of one-time charge or discharge.

According to one or more example embodiments, the leakage current measurement circuit 10 may further include a conversion circuit 500. The conversion circuit 500 may generate an output signal SOUT by converting the activation time tLK of the detection signal SDET to information different from temporal information. In some example embodiments, the output signal SOUT may be an oscillation signal that oscillates with a frequency corresponding to the activation time of the detection signal SDET, as will be described with reference to FIGS. 10 through 17. In some example embodiments, the output signal SOUT may be a digital serial signal including a count value corresponding to the activation time of the detection signal SDET as will be described with reference to FIG. 23.

The output signal SOUT provided as the oscillation signal or the digital serial signal may be provided to an external test device through an input-output pad other than DC measurement pads. As such, the leakage current measurement circuit according to one or more example embodiments may be efficiently adapted to a system having limited input-output pads by converting and providing the information on the leakage current as a frequency of the oscillation signal or the single digital serial signal, and thus the leakage current measurement circuit may be integrated in an SoC efficiently.

Figures 3, 4:
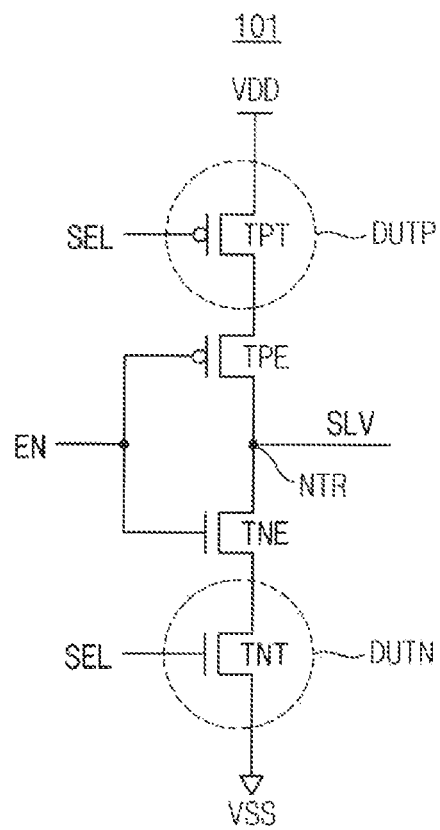
FIG. 3 is a circuit diagram illustrating a leakage generation circuit according to one or more example embodiments.
FIG. 4 is a diagram illustrating operation modes of a leakage current measurement circuit including the leakage generation circuit of FIG. 3 according to one or more example embodiments.

FIG. 3 is a circuit diagram illustrating a leakage generation circuit included in the leakage current measurement circuit of FIG. 1 according to one or more example embodiments.

Referring to FIG. 3, a leakage generation circuit 101 may include an N-type semiconductor component DUTN, an N-type transistor TNE, a P-type semiconductor component DUTP and a P-type transistor TPE.

The N-type semiconductor component DUTN and the P-type semiconductor component DUTP in FIG. 3 are objects of the leakage current measurement. Although FIG. 3 illustrates that the N-type semiconductor component DUTN includes one N-type transistor TNT and the P-type semiconductor component DUTP includes one P-type transistor TPT, configurations of the N-type semiconductor component DUTN and the P-type semiconductor component DUTP may be determined variously.

The N-type semiconductor component DUTN may be connected between a ground voltage VSS and a tracking node NTR where the leakage voltage signal SLV is provided at the tracking node NTR, and the N-type semiconductor component DUTN may operate in response to a selection signal SEL. The N-type transistor TNE may be connected in series with the N-type semiconductor component DUTN between the ground voltage VSS and the tracking node NTR, and the N-type transistor TNE may operate in response to an enable signal EN.

The P-type semiconductor component DUTP may be connected between a power supply voltage VDD and the tracking node NTR, and the P-type semiconductor component DUTP may operate in response to the selection signal SEL. The P-type transistor TPE may be connected in series with the P-type semiconductor component DUTP between the power supply voltage VDD and the tracking node NTR, and the P-type transistor TPE may operate in response to the enable signal EN.

FIG. 4 is a diagram illustrating operation modes of a leakage current measurement circuit including the leakage generation circuit of FIG. 3 according to one or more example embodiments.

Referring to FIGS. 3 and 4, the leakage generation circuit 101 of FIG. 3 and the leakage current measurement circuit 10 of FIG. 1 including the leakage generation circuit 101 may operate selectively in a first operation mode MDN for measuring the leakage current of the N-type semiconductor component DUTN or in a second operation mode MDP for measuring the leakage current of the P-type semiconductor component DUTP.

The selection signal SEL is used to select an object of the leakage current measurement. The selection signal SEL may be fixed to a logic low level L to turn off the N-type semiconductor component DUTN in the first operation mode MDN. In contrast, the selection signal SEL may be fixed to a logic high level H to turn off the P-type semiconductor component DUTP in the second operation mode MDP. As such, the leakage generation circuit 101 may generate the leakage current through the N-type semiconductor component DUTN or the leakage current through the P-type semiconductor component DUTP selectively depending on the logic level of the selection signal SEL.

A transition time point of the enable signal EN may indicate the above-described start time point TS from which the generation of the leakage current begins. The rising transition time point when the enable signal EN transitions from the logic low level L to the logic high level H may correspond to the start time point TS in the first operation mode MDN. In contrast, the falling transition time point when the enable signal EN transitions from the logic high level H to the logic low level L may correspond to the start time point TS in the second operation mode MDP.

Hereinafter, the first operation mode MDN and the second operation mode MDP of a leakage current measurement circuit including the leakage generation circuit 101 of FIG. 3 will be described with reference to FIGS. 5A, 5B, 6A and 6B.

Figure 5A:
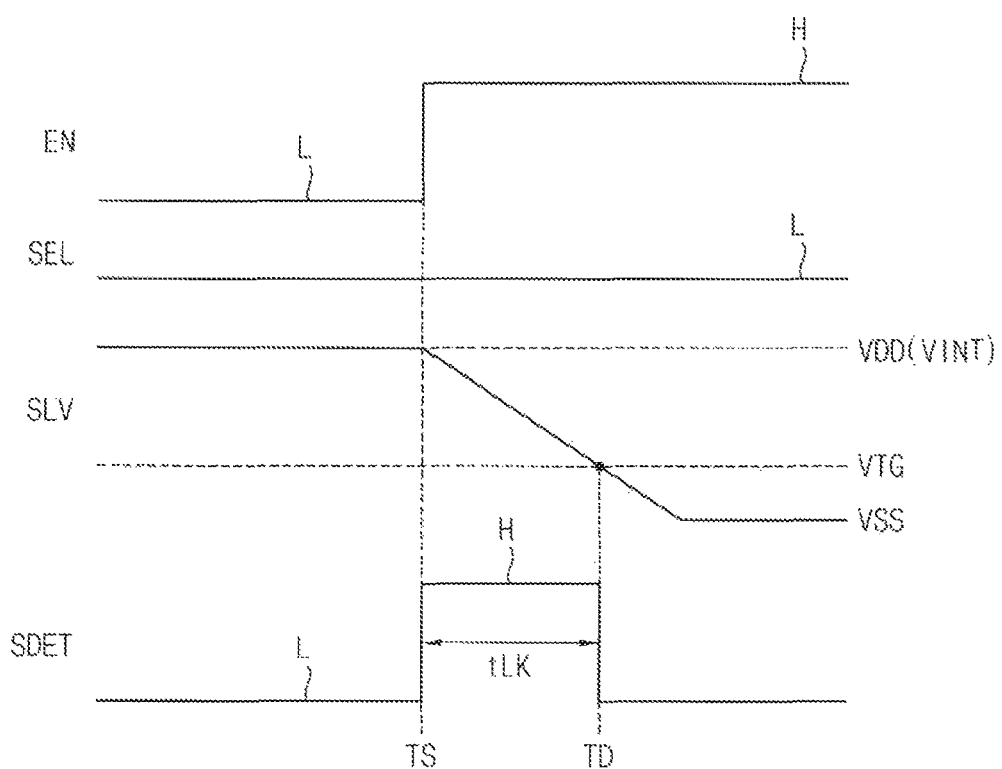
FIGS. 5A and 5B are timing diagrams illustrating a first operation mode of a leakage current measurement circuit including the leakage generation circuit of FIG. 3 according to one or more example embodiments.
Figure 5B:
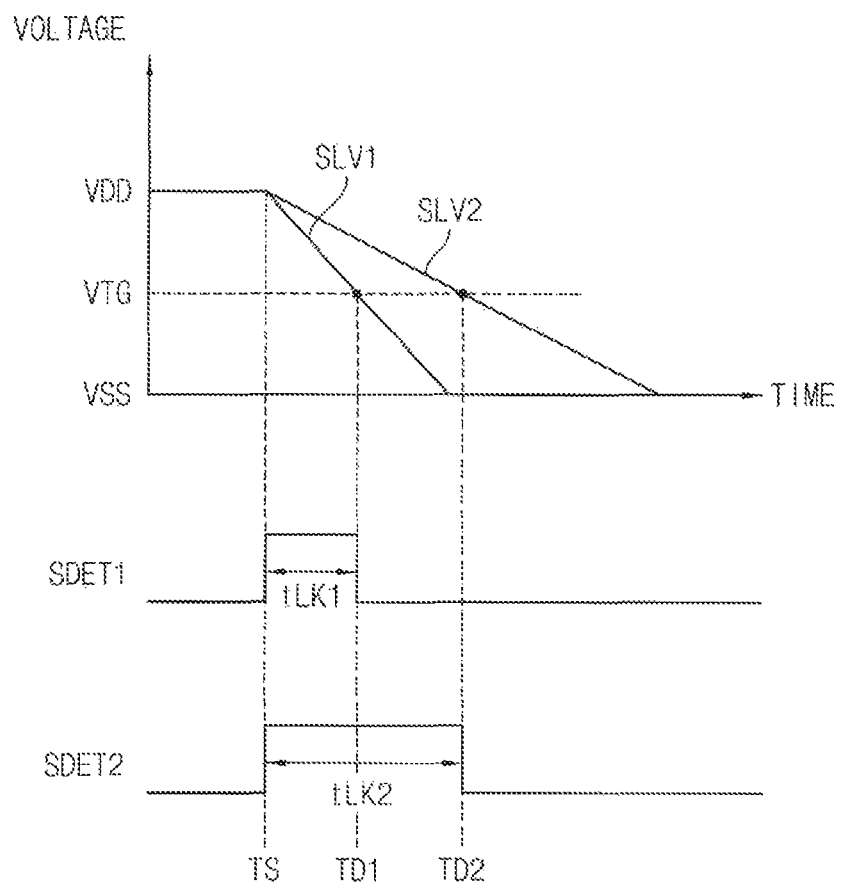

FIGS. 5A and 5B are timing diagrams illustrating a first operation mode of a leakage current measurement circuit including the leakage generation circuit of FIG. 3 according to one or more example embodiments.

Referring to FIGS. 3, 4 and 5A, in the first operation mode MDN, the selection signal SEL may be fixed to the logic low level L and the enable signal EN may transition from the logic low level L to the logic high level H to indicate the start time point TS.

Before the start time point TS, the enable signal EN and the selection signal SEL have the logic low level L. Thus, the P-type semiconductor component DUTP and the P-type transistor TPE are turned on and the N-type semiconductor component DUTN and the N-type transistor TNE are turned off. As a result, the charging operation of the tracking node NTR with the power supply voltage VDD may be performed before the start time point TS.

At the start time point TS corresponding to the rising edge of the enable signal EN, the P-type transistor TPE is turned off and the N-type transistor TNE is turned on. Thus, the charging operation of the tracking node NTR is stopped and the leakage current through the N-type semiconductor component DUTN is generated to discharge the tracking node NTR from the start time point TS. As a result, the leakage voltage signal SLV may be decreased from the power supply voltage VDD corresponding to the initial voltage VINT to the ground voltage VSS via the target voltage VTG.

The detection signal SDET may be activated at the start time point TS when the generation of the leakage current begins and deactivated at the detection time point TD when the voltage level of the leakage voltage signal SLV is decreased to reach the target voltage VTG. In other words, the activation time tLK of the detection signal SDET corresponds to a time interval between the start time point TS and the detection time point TD. Although FIG. 5A illustrates that the detection signal SDET is activated in the logic high level H, the detection signal SDET may be activated in the logic low level L according to a circuit configuration.

In FIG. 5B, a first leakage voltage signal SLV1, a first detection time point TD1, a first detection signal SDET1 and a first activation time tLK1 represent a first case that the leakage current through the N-type semiconductor component DUTN is relatively great, and a second leakage voltage signal SLV2, a second detection time point TD2, a second detection signal SDET2 and a second activation time tLK2 represent a second case that the leakage current through the N-type semiconductor component DUTN is relatively small. For example, the leakage current may be increased as the threshold voltage of the N-type transistor TNT in the N-type semiconductor component DUTN is smaller or its size is larger.

As the leakage current is increased, the discharging speed of a voltage at the tracking node NTR is increased and thus the first leakage voltage signal SLV1 may be decreased more rapidly than the second leakage voltage signal SLV2. As a result, the activation time tLK of the detection signal SDET may be decreased as the leakage current through the N-type semiconductor component DUTN is increased.

Figure 6A:
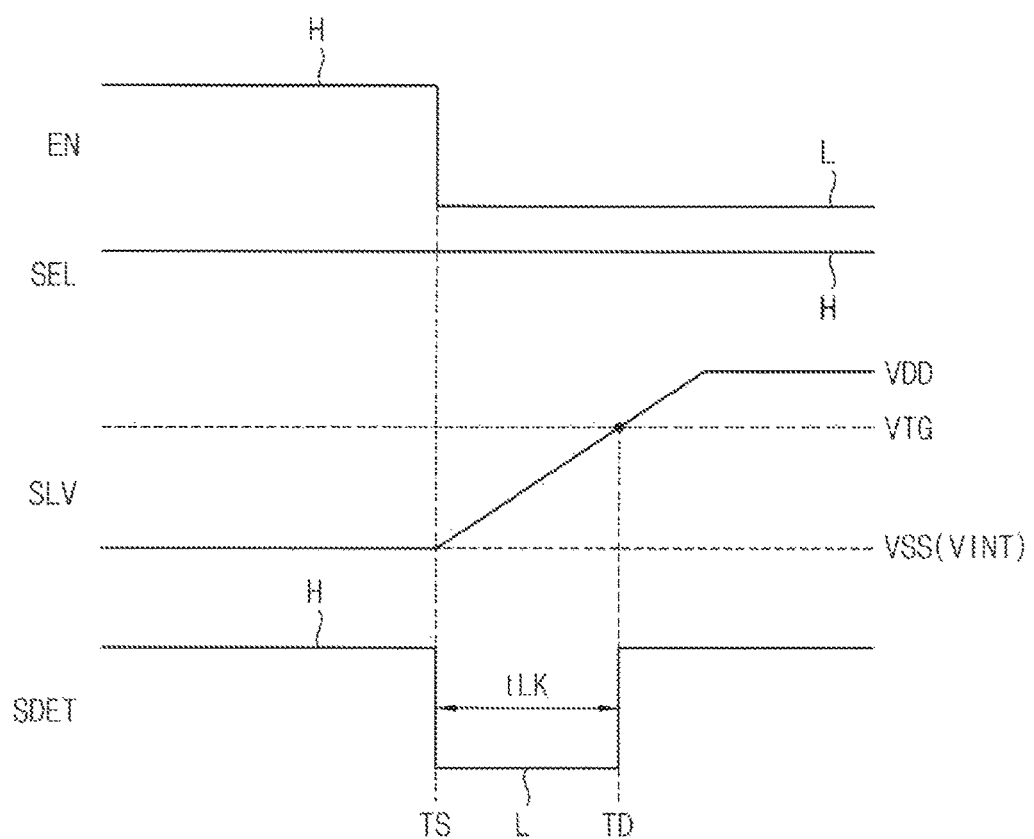
FIGS. 6A and 6B are timing diagrams illustrating a second operation mode of a leakage current measurement circuit including the leakage generation circuit of FIG. 3 according to one or more example embodiments.
Figure 6B:
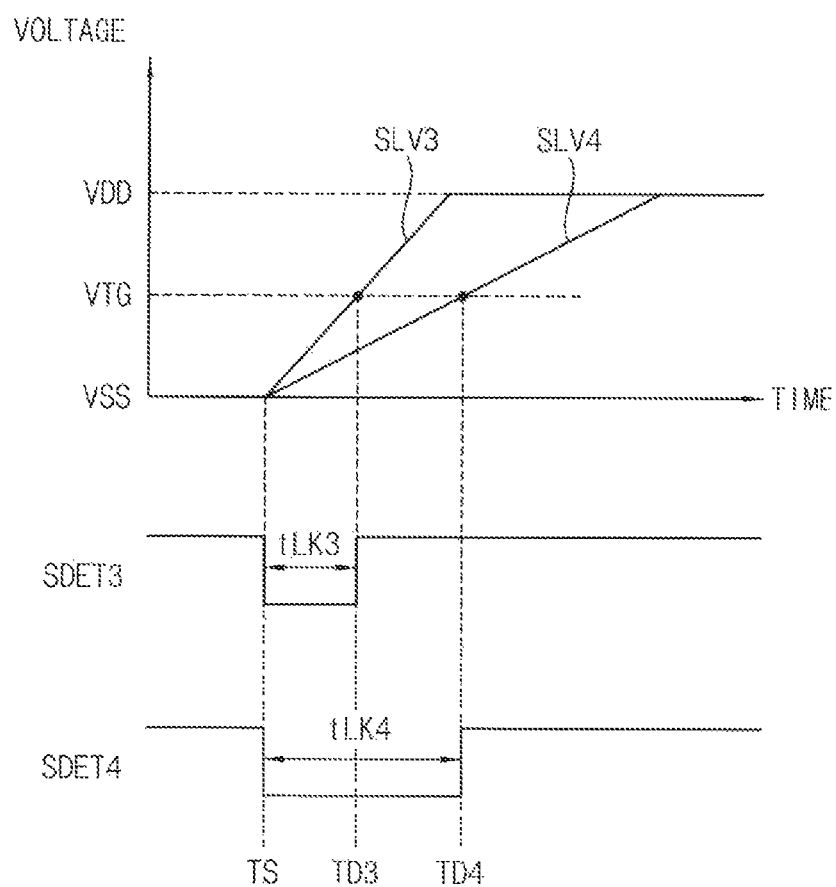

FIGS. 6A and 6B are timing diagrams illustrating a second operation mode of a leakage current measurement circuit including the leakage generation circuit of FIG. 3 according to one or more example embodiments.

Referring to FIGS. 3, 4 and 6A, in the second operation mode MDP, the selection signal SEL may be fixed to the logic high level H and the enable signal EN may transition from the logic high level H to the logic low level L to indicate the start time point TS.

Before the start time point TS, the enable signal EN and the selection signal SEL have the logic high level H. Thus, the P-type semiconductor component DUTP and the P-type transistor TPE are turned off and the N-type semiconductor component DUTN and the N-type transistor TNE are turned on. As a result, the discharging operation of the tracking node NTR with the ground voltage VSS may be performed before the start time point TS.

At the start time point TS corresponding to the falling edge of the enable signal EN, the P-type transistor TPE is turned on and the N-type transistor TNE is turned off. Thus, the discharging operation of the tracking node NTR is stopped and the leakage current through the P-type semiconductor component DUTP is generated to charge the tracking node NTR from the start time point TS. As a result, the leakage voltage signal SLV may be increased from the ground voltage VSS corresponding to the initial voltage VINT to the power supply voltage VDD via the target voltage VTG.

The detection signal SDET may be activated at the start time point TS when the generation of the leakage current begins and deactivated at the detection time point TD when the voltage level of the leakage voltage signal SLV is increased to reach the target voltage VTG. In other words, the activation time tLK of the detection signal SDET corresponds to a time interval between the start time point TS and the detection time point TD. Although FIG. 6A illustrates that the detection signal SDET is activated in the logic low level L, the detection signal SDET may be activated in the logic high level H according to a circuit configuration.

In FIG. 6B, a third leakage voltage signal SLV3, a third detection time point TD3, a third detection signal SDET3 and a third activation time tLK3 represent a third case that the leakage current through the P-type semiconductor component DUTP is relatively great, and a fourth leakage voltage signal SLV4, a fourth detection time point TD4, a fourth detection signal SDET4 and a fourth activation time tLK4 represent a fourth case that the leakage current through the P-type semiconductor component DUTP is relatively small. For example, the leakage current may be increased as the threshold voltage of the P-type transistor TPT in the P-type semiconductor component DUTP is smaller or its size is larger.

As the leakage current is increased, the charging speed of a voltage at the tracking node NTR is increased and thus the third leakage voltage signal SLV3 may increase more rapidly than the fourth leakage voltage signal SLV4. As a result, the activation time tLK of the detection signal SDET may be decreased as the leakage current through the P-type semiconductor component DUTN is increased.

Figure 7:
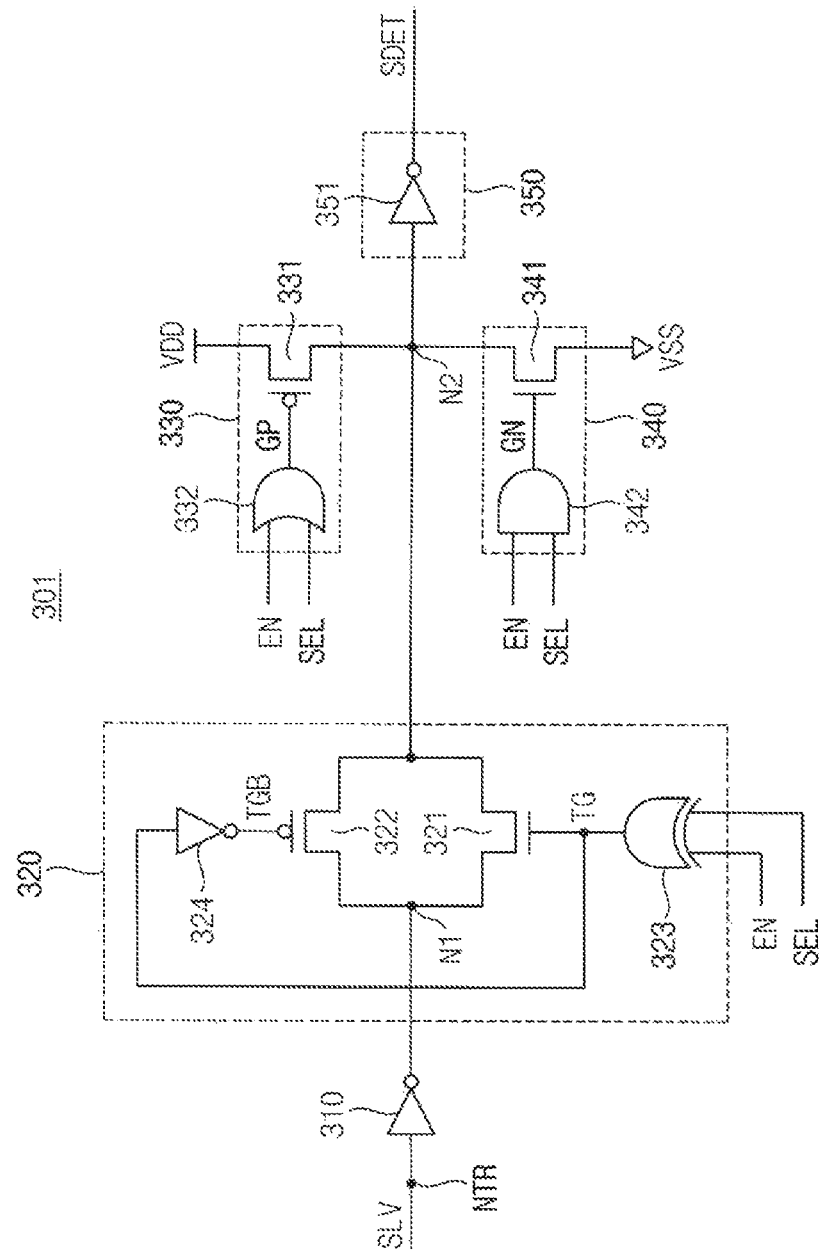
FIG. 7 is a circuit diagram illustrating a detection circuit according to one or more example embodiments.

FIG. 7 is a circuit diagram illustrating a detection circuit included in the leakage current measurement circuit of FIG. 1 according to one or more example embodiments.

Referring to FIG. 7, a detection circuit 301 includes a detection inverter 310, a transfer unit 320, a reset unit 330 and 340, and an output driving unit 350.

The detection inverter 310 has an input terminal connected to the tracking node NTR providing the leakage voltage signal SLV and an output node connected to a first node N1.

The transfer unit 320 electrically connects the first node N1 to a second node N2 from the start time point TS. The transfer unit 320 may include a first N-type transistor 321, a first P-type transistor 322, an XOR gate 323 and an inverter 324. The first N-type transistor 321 and the first P-type transistor 322 form a transmission gate, and the XOR gate 323 and the inverter 324 control the transmission gate 321 and 322. The XOR gate 323 performs an XOR operation on the enable signal EN and the selection signal SEL to generate a transmission control signal TG and inverter 324 inverts the transmission control signal TG to generate an inverted transmission control signal TGB. The transmission control signal TG is applied to a gate electrode of the first N-type transistor 321 and the inverted transmission control signal TGB is applied to a gate electrode of the first P-type transistor 322.

The reset unit 330 and 340 resets a voltage at the second node N2 before the start time point TS. The reset unit 330 and 340 may include a first reset unit 330 configured to reset the voltage at the second node N2 to the power supply voltage VDD and a second reset unit 340 configured to reset the voltage at the second node N2 to the ground voltage VSS.

The first reset unit 330 may include a second P-type transistor 331 connected between the power supply voltage VDD and the second node N2 and an OR gate 332 to control the second P-type transistor 331. The OR gate 332 performs an OR operation on the enable signal EN and the selection signal SEL to generate a first gate signal GP, which is applied to a gate electrode of the second P-type transistor 331.

The second reset unit 340 may include a second N-type transistor 341 connected between the ground voltage VSS and the second node N2 and an AND gate 342 to control the second N-type transistor 341. The AND gate 342 performs an AND operation on the enable signal EN and the selection signal SEL to generate a second gate signal GN, which is applied to a gate electrode of the second N-type transistor 341.

The output driving unit 350 generates the detection signal SDET based on the voltage at the second node N2. Although FIG. 7 illustrates that the output driving unit 350 includes one inverter 351, a configuration of the output driving unit 350 may be determined variously.

Hereinafter, the first operation mode MDN and the second operation mode MDP of a leakage current measurement circuit including the detection circuit 301 of FIG. 7 will be described with reference to FIGS. 8 and 9.

Figure 8:
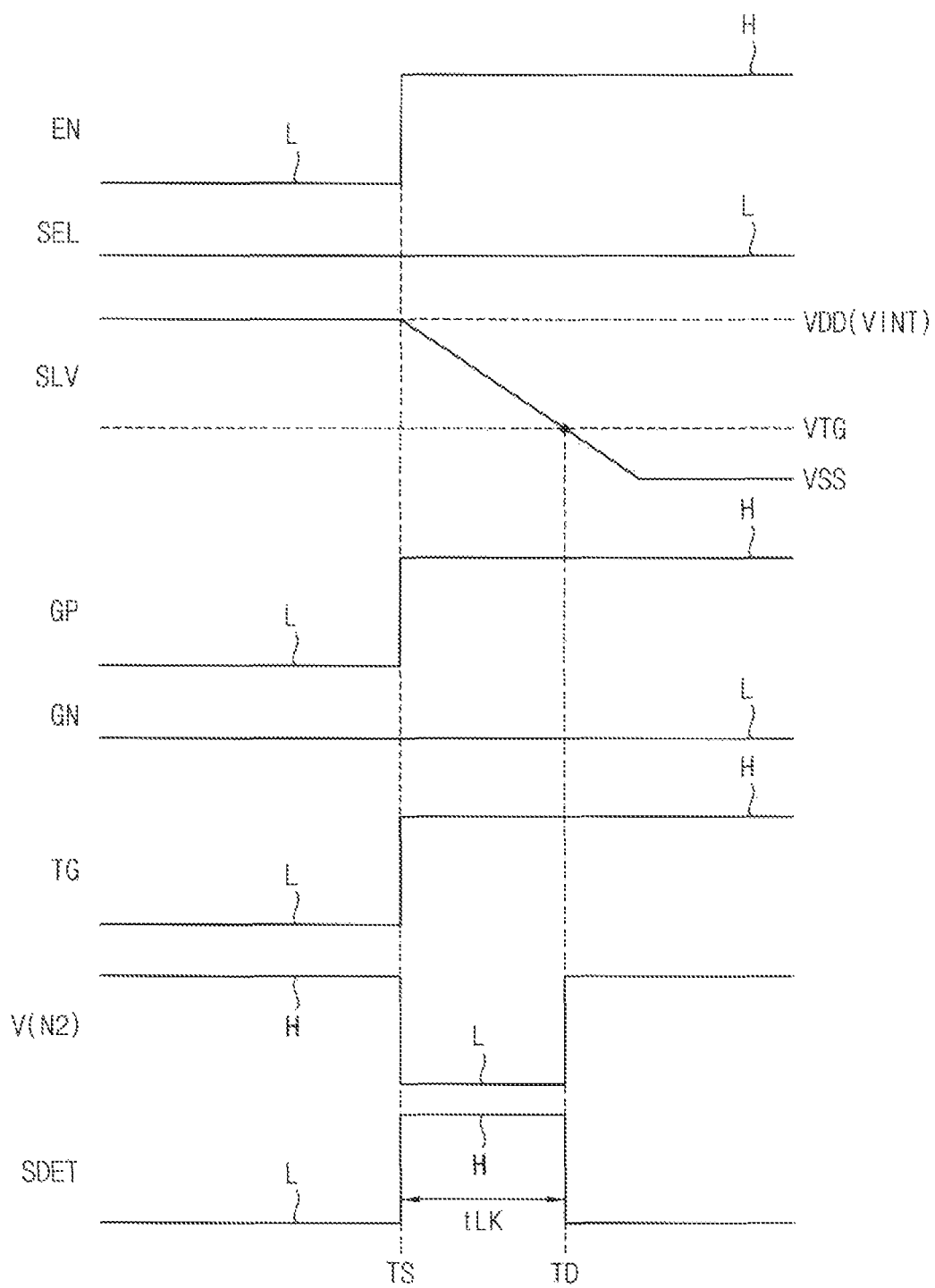
FIG. 8 is a timing diagram illustrating a first operation mode of a leakage current measurement circuit including the detection circuit of FIG. 7 according to one or more example embodiments.

FIG. 8 is a timing diagram illustrating a first operation mode of a leakage current measurement circuit including the detection circuit of FIG. 7 according to one or more example embodiments.

Referring to FIGS. 7 and 8, in the first operation mode MDN, the selection signal SEL may be fixed to the logic low level L and the enable signal EN may transition from the logic low level L to the logic high level H to indicate the start time point TS.

Before the start time point TS, the enable signal EN and the selection signal SEL have the logic low level L. Thus, the second P-type transistor 331 is turned on and the second N-type transistor 341 is turned off. As a result, the reset operation may be performed before the start time point TS to reset the voltage V(N2) at the second node N2 to the power supply voltage VDD.

At the start time point TS corresponding to the rising edge of the enable signal EN, the first gate signal GP and the transmission control signal TG transition to the logic high level H to turn off the second P-type transistor 331 and turn on the transmission gate 321 and 322.

Accordingly the voltage V(N2) at the second node N2 and the detection signal SDET are activated at the start time point TS and deactivated at the detection time point TD when the decreasing voltage level of the leakage voltage signal SLV reaches the target voltage VTG. Thus, the time interval between the start time point TS and the detection time point TD corresponds to the activation time tLK of the detection signal SDET.

Figure 9:
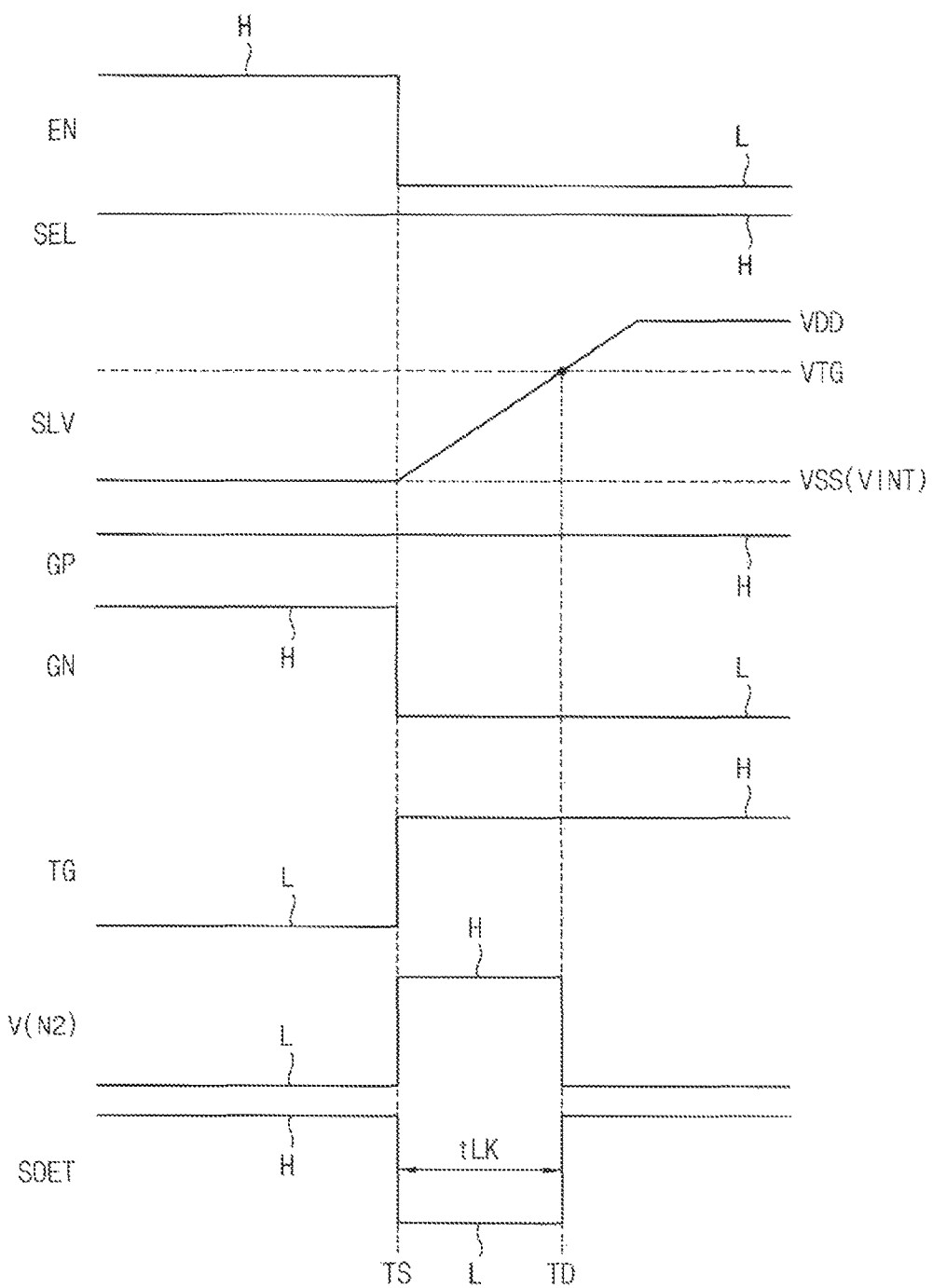
FIG. 9 is a timing diagram illustrating a second operation mode of a leakage current measurement circuit including the detection circuit of FIG. 7 according to one or more example embodiments.

FIG. 9 is a timing diagram illustrating a second operation mode of a leakage current measurement circuit including the detection circuit of FIG. 7 according to one or more example embodiments.

Referring to FIGS. 7 and 9, in the second operation mode MDN, the selection signal SEL may be fixed to the logic high level H and the enable signal EN may transition from the logic high level H to the logic low level L to indicate the start time point TS.

Before the start time point TS, the enable signal EN and the selection signal SEL have the logic high level H. Thus, the second P-type transistor 331 is turned off and the second N-type transistor 341 is turned on. As a result, the reset operation may be performed before the start time point TS to reset the voltage V(N2) at the second node N2 to the ground voltage VSS.

At the start time point TS corresponding to the falling edge of the enable signal EN, the second gate signal GN transitions to the logic low level L and the transmission control signal TG transitions to the logic high level H to turn off the second N-type transistor 341 and turn on the transmission gate 321 and 322.

Accordingly the voltage V(N2) at the second node N2 and the detection signal SDET are activated at the start time point TS and deactivated at the detection time point TD when the increasing voltage level of the leakage voltage signal SLV reaches the target voltage VTG. Thus, the time interval between the start time point TS and the detection time point TD corresponds to the activation time tLK of the detection signal SDET.

Figure 10:
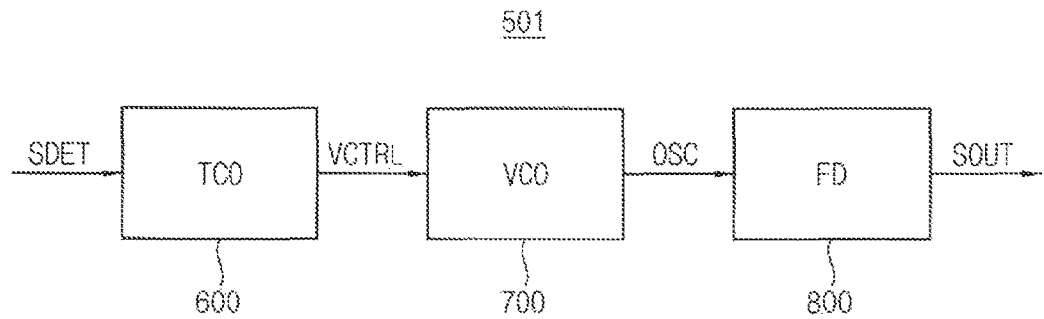
FIG. 10 is a block diagram illustrating a conversion circuit included in the leakage current measurement circuit of FIG. 1 according to one or more example embodiments.

FIG. 10 is a block diagram illustrating a conversion circuit included in the leakage current measurement circuit of FIG. 1 according to one or more example embodiments.

Referring to FIG. 10, a conversion circuit 501 may include a time-voltage converter TCO 600, a voltage-controlled oscillator VCO 700 and a frequency divider FD 800.

The time-voltage converter 600 may provide a control voltage VCTRL corresponding to the activation time tLK of the detection signal SDET based on the detection signal SDET. The time-voltage converter 600 will be further described below with reference to FIGS. 11, 12A, 12B and 13.

The voltage-controlled oscillator 700 may generate an oscillation signal OSC having a frequency corresponding to the activation time tLK of the detection signal SDET based on the control voltage VCTRL. The voltage-controlled oscillator 700 will be further described with reference to FIGS. 14 through 17.

The frequency divider 800 may divide the frequency of the oscillation signal OSC to generate the output signal SOUT. The frequency divider 800 may perform down-conversion of the frequency of the oscillation signal OSC to provide the output signal SOUT having a reduced frequency that is measurable by an external test device. In some example embodiments, the frequency divider 800 may be omitted and the oscillation signal OSC itself may be provided as the output signal SOUT.

Figure 11:
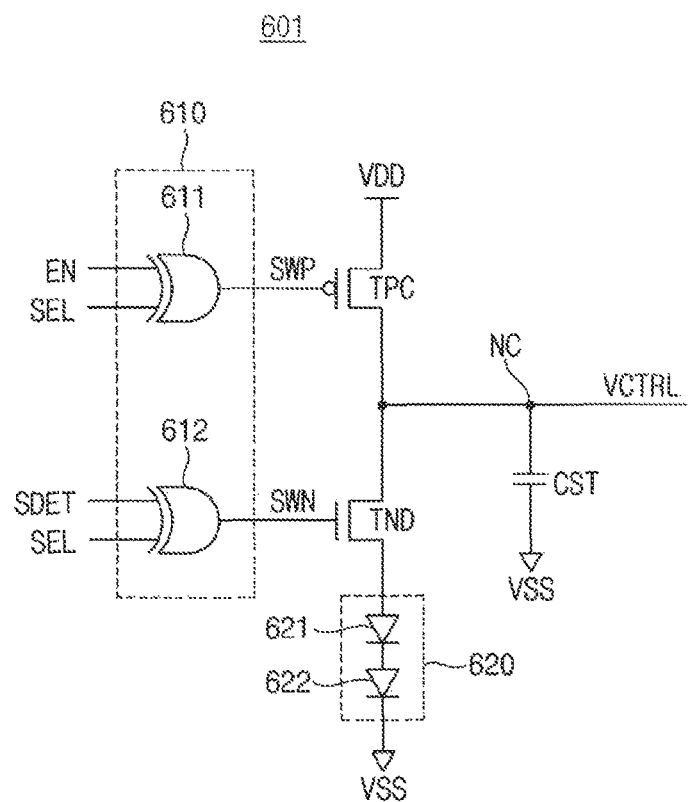
FIG. 11 is a circuit diagram illustrating a time-voltage converter included in the conversion circuit of FIG. 10 according to one or more example embodiments.

FIG. 11 is a circuit diagram illustrating a time-voltage converter included in the conversion circuit of FIG. 10 according to one or more example embodiments.

Referring to FIG. 11, a time-voltage converter 601 may include a control unit 610 (e.g., controller), a storage capacitor CST, a charging switch TPC and a discharging unit TND and 620.

The storage capacitor is connected between a storage node NC, which provides the control voltage, and the ground voltage VSS. The charging switch TPC resets a voltage at the storage node NC with the power supply voltage VDD before the start time point TS. The discharging unit TND and 620 may include a discharging switch TND and a diode unit 620 configured to discharge the voltage at the storage node NC during the activation time tLK of the detection signal SDET. The diode unit 620 may include one or more diodes 621 and 622.

The control unit 610 may include a first XOR gate 611 and a second XOR gate 612. The first XOR gate 611 performs an XOR operation on the enable signal EN and the selection signal SEL and generates a first switch signal SWP to control the charging switch TPC. The second XOR gate 612 performs an XOR operation on the enable signal EN and the detection signal SDET and generates a second switch signal SWN to control the discharging switch TND.

Hereinafter, the first operation mode MDN and the second operation mode MDP of the time-voltage converter 601 of FIG. 11 will be described with reference to FIGS. 12A and 12B.

Figure 12A:
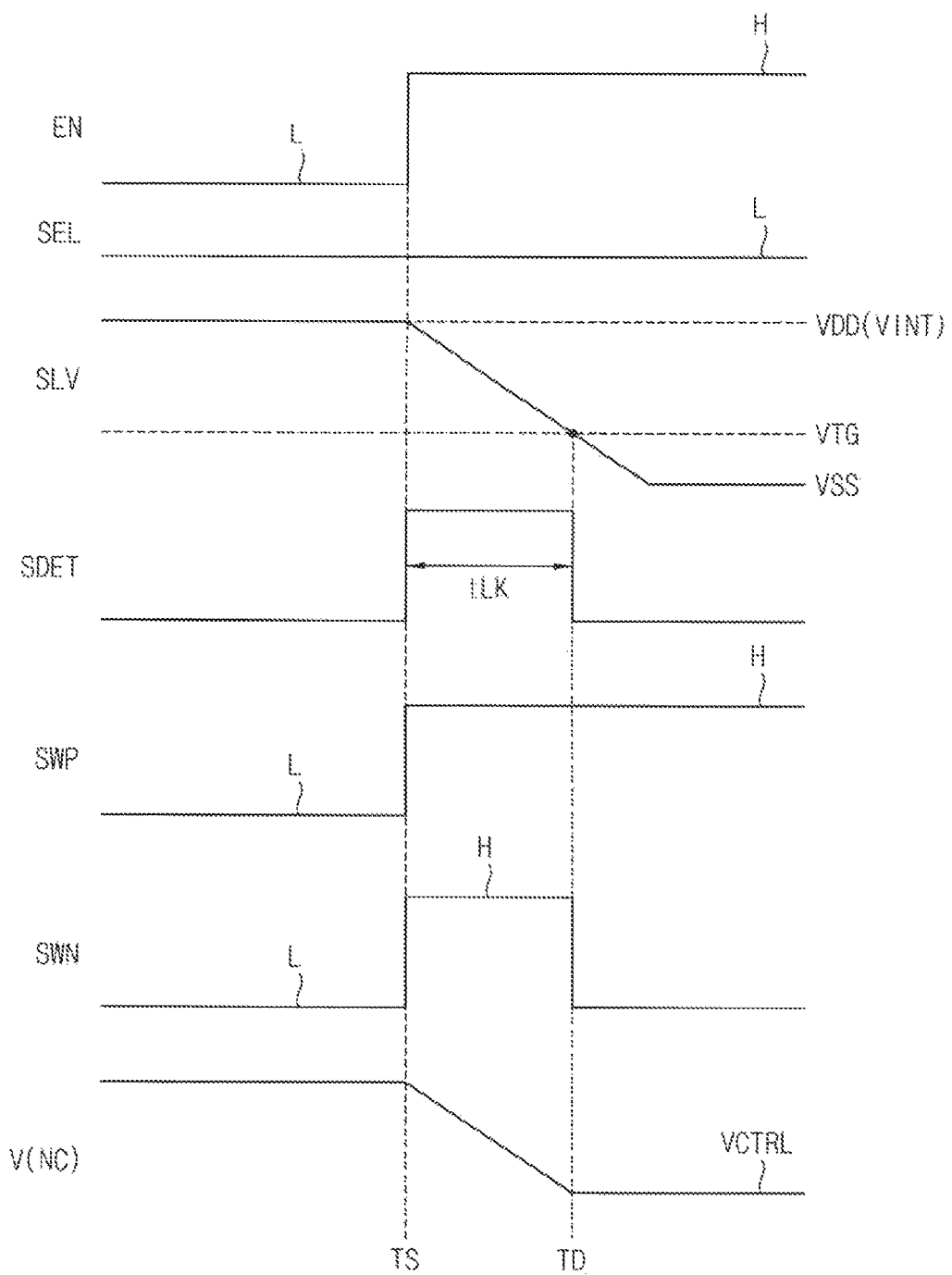
FIG. 12A is a timing diagram illustrating a first operation mode of a leakage current measurement circuit including the time-voltage converter of FIG. 11 according to one or more example embodiments.

FIG. 12A is a timing diagram illustrating a first operation mode of a leakage current measurement circuit including the time-voltage converter of FIG. 11 according to one or more example embodiments.

Referring to FIGS. 11 and 12A, in the first operation mode MDN, the selection signal SEL may be fixed to the logic low level L and the enable signal EN may transition from the logic low level L to the logic high level H to indicate the start time point TS.

Before the start time point TS, the first switch signal SWP and the second switch signal SWN have the logic low level L. Thus, the charging switch TPC is turned on and the discharging switch TND is turned off. As a result, the charging operation may be performed before the start time point TS to reset the voltage V(NC) at the storage node NC to the power supply voltage VDD.

At the start time point TS corresponding to the rising edge of the enable signal EN, the first switch signal SWP and the second switch signal SWN transition to the logic high level H to turn off the charging switch TPC and turn on the discharging switch TND. Accordingly, the voltage V(NC) at the storage node NC begins to be discharged through the diode unit 620 at the start time point TS.

At the detection time point TD when the decreasing detection signal SDET reaches the target voltage VTG, the second switch signal SWN transitions to the logic low level L to turn off the discharging switch TND, and the discharging operation of the voltage V(NC) at the storage node NC is ended.

As a result, in the first operation mode MDN, the voltage V(NC) at the storage node NC is decreased from the reset voltage during the activation time tLK and then maintains the control voltage VCTRL.

Figure 12B:
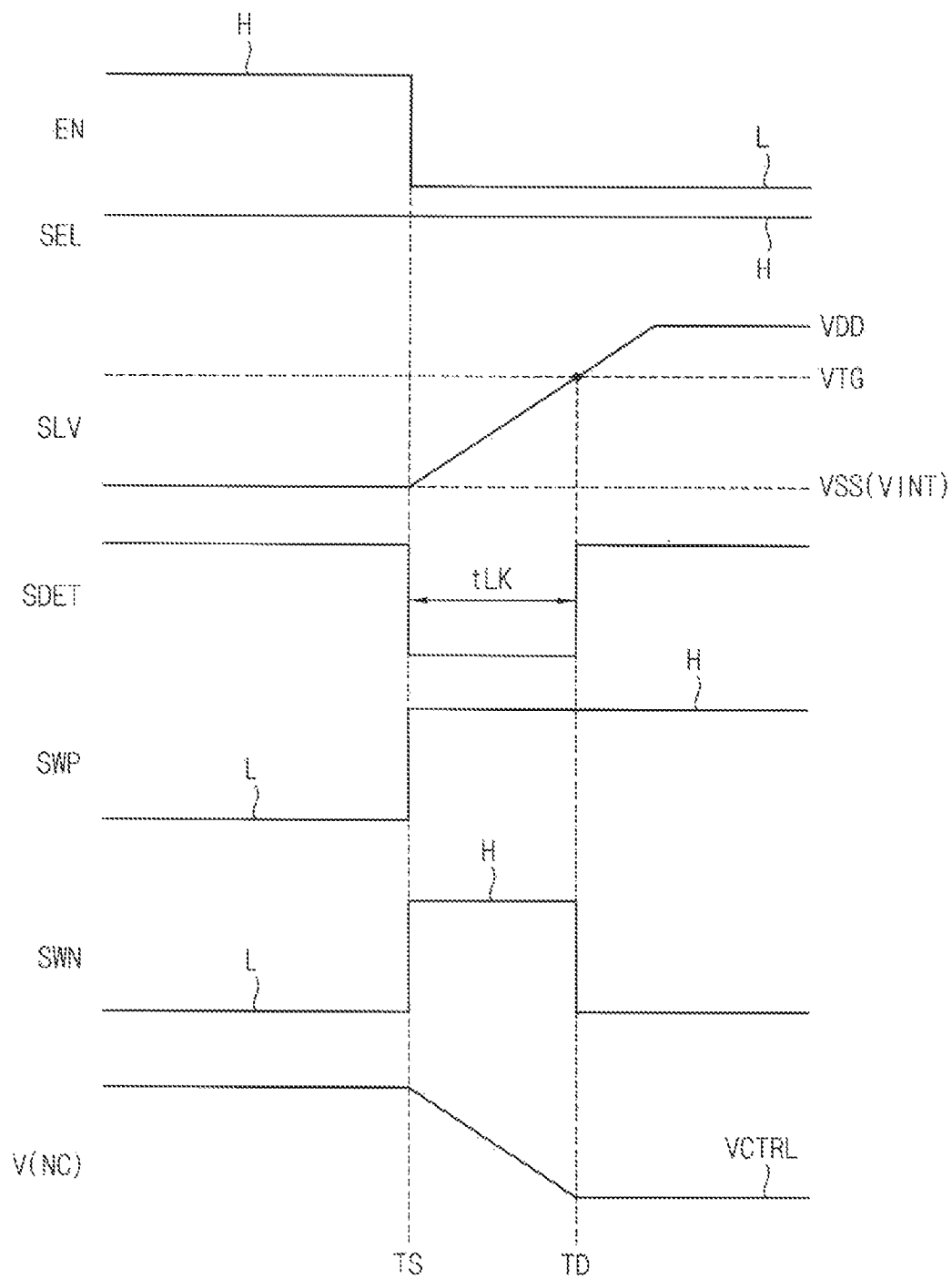
FIG. 12B is a timing diagram illustrating a second operation mode of a leakage current measurement circuit including the time-voltage converter of FIG. 11 according to one or more example embodiments.

FIG. 12B is a timing diagram illustrating a second operation mode of a leakage current measurement circuit including the time-voltage converter of FIG. 11 according to one or more example embodiments.

Referring to FIGS. 11 and 12B, in the second operation mode MDP, the selection signal SEL may be fixed to the logic high level H and the enable signal EN may transition from the logic high level H to the logic low level L to indicate the start time point TS.

Before the start time point TS, the first switch signal SWP and the second switch signal SWN have the logic low level L. Thus, the charging switch TPC is turned on and the discharging switch TND is turned off. As a result, the charging operation may be performed before the start time point TS to reset the voltage V(NC) at the storage node NC to the power supply voltage VDD.

At the start time point TS corresponding to the rising edge of the enable signal EN, the first switch signal SWP and the second switch signal SWN transition to the logic high level H to turn off the charging switch TPC and turn on the discharging switch TND. Accordingly, the voltage V(NC) at the storage node NC begins to be discharged through the diode unit 620 at the start time point TS.

At the detection time point TD when the increasing detection signal SDET reaches the target voltage VTG, the second switch signal SWN transitions to the logic low level L to turn off the discharging switch TND, and the discharging operation of the voltage V(NC) at the storage node NC is ended.

As a result, in the second operation mode MDP, the voltage V(NC) at the storage node NC is decreased from the reset voltage during the activation time tLK and then maintains the control voltage VCTRL.

As such, the control voltage VCTRL may be decreased and the activation time tLK is increased in both of the first operation mode MDN and the second operation mode MDP. As described above, the activation time tLK of the detection signal SDET is decreased as the leakage current is increased. Thus, the control voltage VCTRL may be increased as the leakage current is increased.

The control voltage VCTRL is provided to the voltage-controlled oscillator 700 and the voltage-controlled oscillator 700 may generate the oscillation signal OSC having the frequency corresponding to the control voltage VCTRL. As described below, the voltage-controlled oscillator 700 may increase the frequency of the oscillation signal OSC, as the activation time tLK of the detection signal SDET is decreased, that is, as the control voltage VCTRL is increased.

Figure 13:
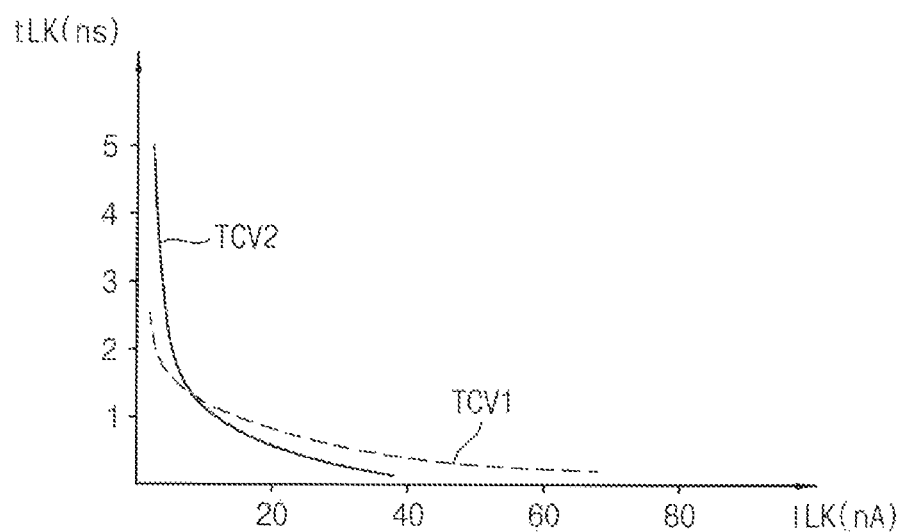
FIG. 13 is a diagram illustrating a relation of an activation time of a detection signal and a leakage current according to one or more example embodiments.

FIG. 13 is a diagram illustrating a relation of an activation time of a detection signal and a leakage current according to one or more example embodiments.

In FIG. 13, the horizontal axis indicates the leakage current ILK in the unit of nanoampere (nA) and the vertical axis indicates the activation time or the leakage time tLK in the unit of nanosecond (ns). A first curve TCV1 represents a case that the leakage current ILK of the device under test is relatively great and s second curve TCV2 represents a case that the leakage current ILK is relatively small.

FIG. 13 shows nonlinear correlation between the leakage current ILK and the leakage time tLK. Because of such nonlinear correlation, a range of the control voltage VCTRL has to be wide so the leakage current ILK for transistors of various threshold voltages and sizes can be measured. For example, the size of the storage capacitor CST in FIG. 11 can be increased to provide the wide range of the control voltage VCTRL. A current source for providing a constant current may be used to provide a wide range of the control voltage VCTRL. However, if the current source is used, the size of the storage capacity CST is increased exponentially according to the size of the semiconductor component under test. As such, the occupation area of the leakage current measurement circuit may be increased.

According to one or more example embodiments, exponential increase in the current of a diode may be used instead of the constant current source. A wide range of the control voltage VCTRL may be implemented by stacking the diodes 621 and 622 as illustrated in FIG. 11, and thus the size of the storage capacitor CST may be reduced.

Figure 14:
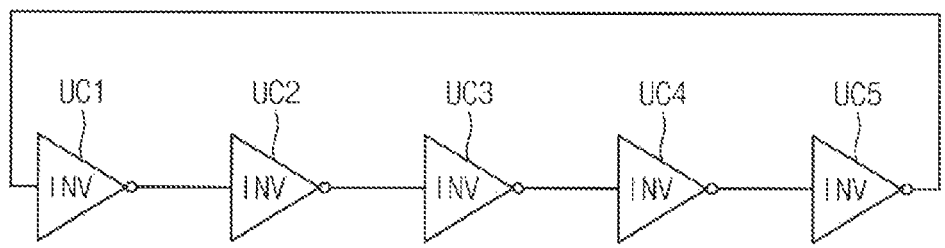
FIG. 14 is a diagram illustrating a voltage-controlled oscillator included in the conversion circuit of FIG. 10 according to one or more example embodiments.

FIG. 14 is a diagram illustrating a voltage-controlled oscillator included in the conversion circuit of FIG. 10 according to one or more example embodiments.

Figure 15:
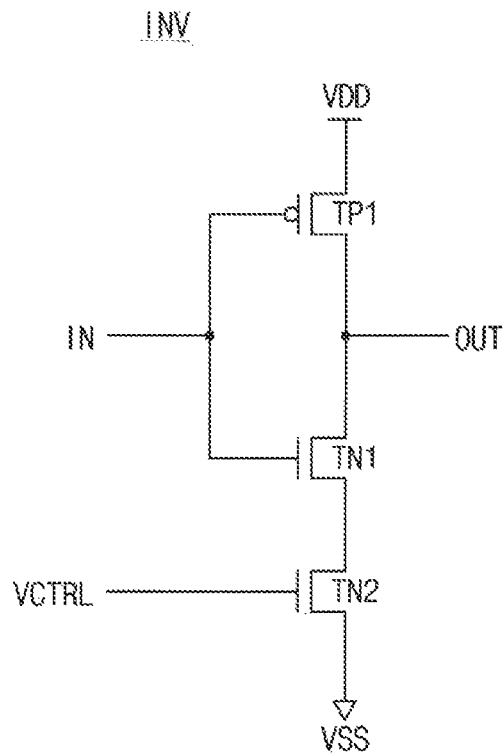
FIG. 15 is a circuit diagram illustrating a circuit included in the voltage-controlled oscillator of FIG. 14 according to one or more example embodiments.

Referring to FIG. 14, a voltage-controlled oscillator 701 may include a plurality of unit circuits UC1~UC5 that are cascade-connected. FIG. 15 illustrates five unit circuits, but this is an example and the number of unit circuits may be determined variously. The unit circuits UC1~UC5 may form a ring oscillator such that the output of a last unit circuit (e.g., UC5) is provided as the input of a first unit circuit (e.g., UC1). As illustrated in FIG. 14, the voltage-controlled oscillator 701 may be a single-ended ring oscillator such that the plurality of unit circuits UC1~UC5 are implemented with inverters INV.

FIG. 15 is a circuit diagram illustrating a unit circuit included in the voltage-controlled oscillator of FIG. 14 according to one or more example embodiments.

Referring to FIG. 15, a unit circuit may be implemented with an inverter INV including a first P-type transistor TP1, a first N-type transistor TN1 and a second N-type transistor TN2. The first P-type transistor TP1 and the first N-type transistor TN1 receive an input signal IN to generate an output signal OUT, and the second N-type transistor receives the control voltage VCTRL as a bias voltage. As the control voltage VCTRL is increased, a sinking current flowing to the ground voltage VSS through the second N-type transistor TN2 is increased, the operation speed of the voltage-controlled oscillator 701 is increased and thus the frequency of the oscillation signal OSC is increased.

Figure 16:
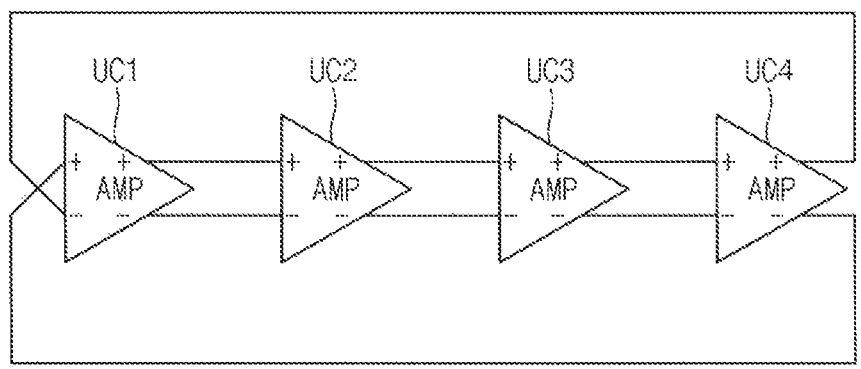
FIG. 16 is a diagram illustrating a voltage-controlled oscillator included in the conversion circuit of FIG. 10 according to one or more example embodiments.

FIG. 16 is a diagram illustrating a voltage-controlled oscillator included in the conversion circuit of FIG. 10 according to one or more example embodiments.

Referring to FIG. 16, a voltage-controlled oscillator 702 may include a plurality of unit circuits UC1~UC4 that are cascade-connected. FIG. 16 illustrates four unit circuits as a non-limiting example but the number of unit circuits may be determined variously. The unit circuits UC1~UC4 may form a ring oscillator such that the output of a last unit circuit (e.g., UC4) is provided as the input of a first unit circuit (e.g., UC1). As illustrated in FIG. 16, the voltage-controlled oscillator 702 may be a differential ring oscillator such that the plurality of unit circuits UC1~UC4 are implemented with differential amplifiers AMP.

Figure 17:
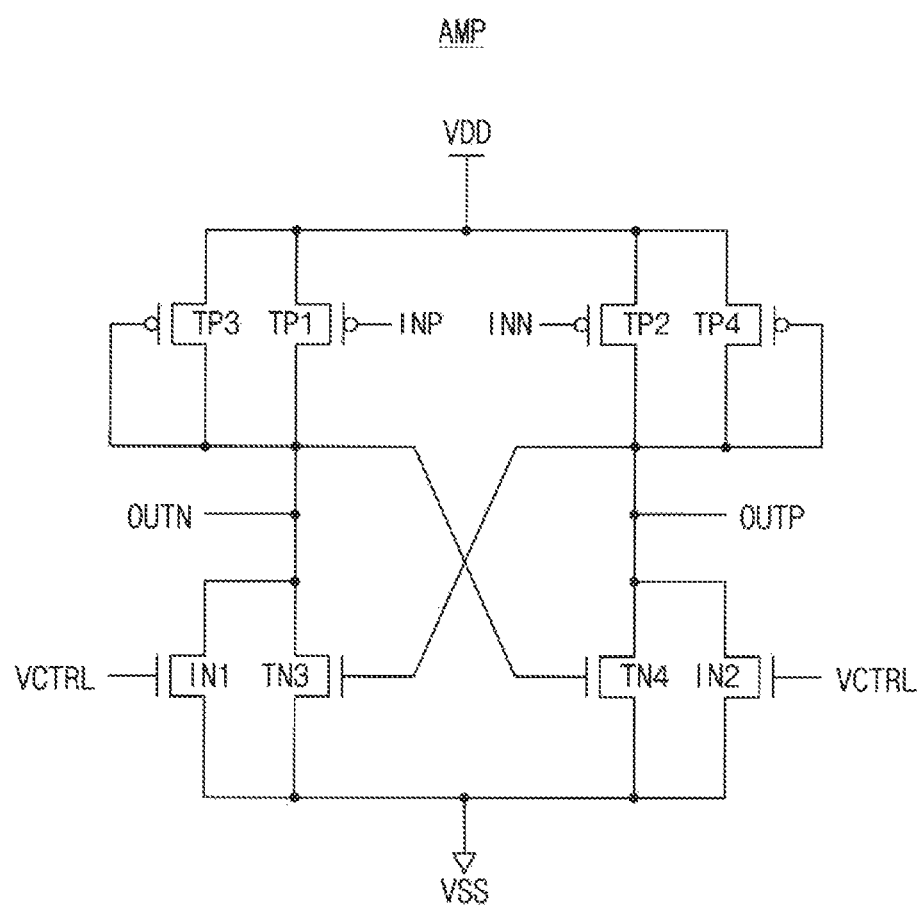
FIG. 17 is a circuit diagram illustrating a circuit included in the voltage-controlled oscillator of FIG. 16 according to one or more example embodiments.

FIG. 17 is a circuit diagram illustrating a unit circuit included in the voltage-controlled oscillator of FIG. 16 according to one or more example embodiments.

Referring to FIG. 17, a unit circuit may be implemented with a differential amplifier AMP or a differential delay circuit including a plurality of P-type transistors TP1~TP4 and a plurality of N-type transistors TN1~TN4, which are coupled between the power supply voltage VDD and the ground voltage VSS. The differential delay circuit may have a cross-coupled structure such that a differential output signal OUTP and OUTN is applied as a bias of the N-type transistors TN3 and TN4 and the P-type transistors TP3 and TP4, for good linearity and low power operation. An differential input signal INP and INN is applied to gate electrodes of the P-type transistor pair TP1 and TP2, and the control voltage VCTRL is applied to the N-type transistor pair TN1 and TN2. As the control voltage VCTRL is increased, a sinking current flowing to the ground voltage VSS through the N-type transistor pair TN1 and TN2 is increased, the operation speed of the voltage-controlled oscillator 702 is increased and thus the frequency of the oscillation signal OSC is increased.

Figure 18:
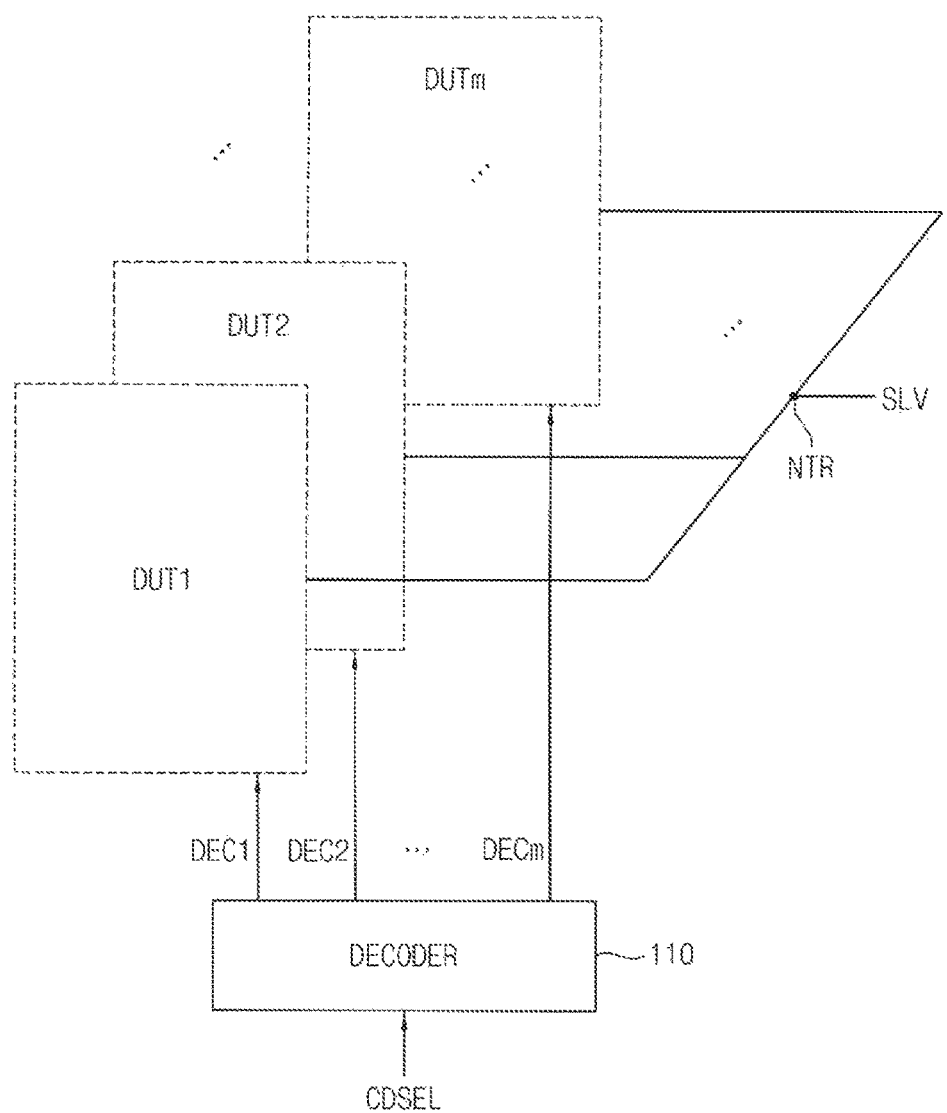
FIG. 18 is a circuit diagram illustrating a leakage generation circuit included in the leakage current measurement circuit of FIG. 1 according to one or more example embodiments.

FIG. 18 is a circuit diagram illustrating a leakage generation circuit included in the leakage current measurement circuit of FIG. 1 according to one or more example embodiments.

Referring to FIG. 18, a leakage current measurement circuit 102 includes a decoder 110 and a plurality of devices DUT1~DUTm under test.

The plurality of devices DUT1~DUTm under test are commonly connected to a tracking node NTR that provides a leakage voltage signal SLV, and the plurality of devices DUT1~DUTm under test have different leakage characteristics.

The decoder 110 generates a plurality of decoded bit signals DEC1~DECm based on a selection code CDSEL to provide the plurality of decoded bit signals DEC1~DECm to the plurality of devices DUT1~DUTm under test, respectively. The leakage current measurement circuit 102 may select one device to test from among the plurality of devices DUT1~DUTm based on the plurality of decoded bit signals DEC1~DECm, and generate the leakage voltage signal SLV using the selected one device under test. For the selection of one device under test, one decoded bit signal DECi from among the plurality of decoded bit signal DEC1~DECm may be selectively activated, which corresponds to the device DUTi under test to be an object of the leakage current measurement.

According to one or more example embodiments, the decoder 110 may be included in another circuit in the leakage current measurement circuit 102 or in an external test device.

Figure 19:
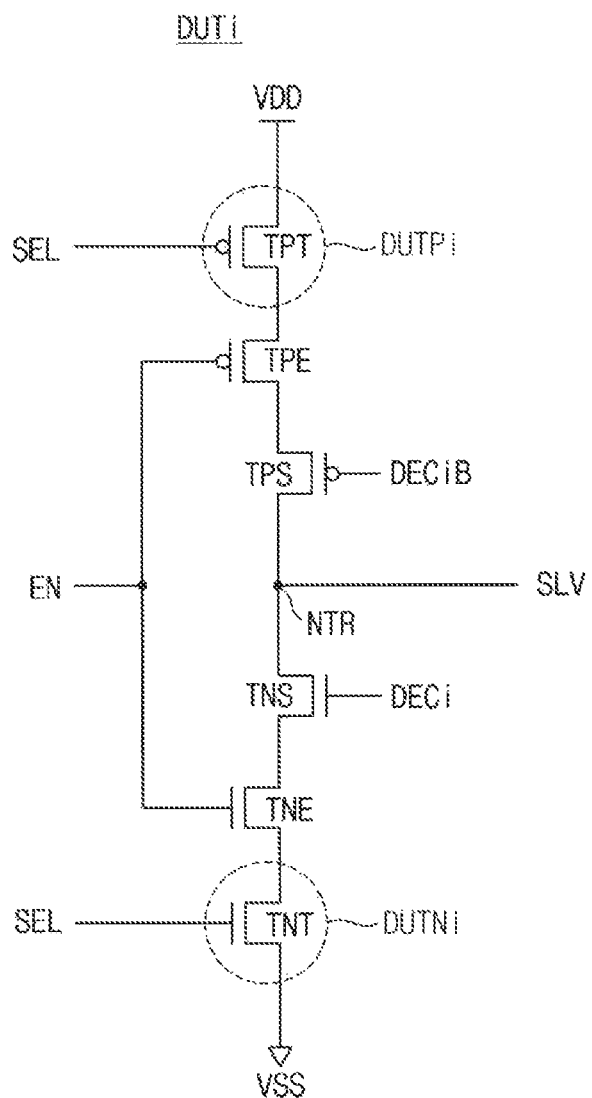
FIG. 19 is a circuit diagram illustrating a device under test included in the leakage generation circuit of FIG. 18 according to one or more example embodiments.

FIG. 19 is a circuit diagram illustrating a device under test included in the leakage generation circuit of FIG. 18 according to one or more example embodiments.

Referring to FIG. 19, a leakage generation circuit DUTi may include an N-type semiconductor component DUTN, a first N-type transistor TNE, a second N-type transistor TNS, a P-type semiconductor component DUTP, a first P-type transistor TPE and a second P-type transistor TPS.

The device under test DUTi of FIG. 19 is similar to the leakage generation circuit 101 of FIG. 3, and thus the repeated descriptions are omitted. In comparison with the leakage generation circuit 101 of FIG. 3, the device under test DUTi of FIG. 19 further includes the second N-type transistor TNS and the second P-type transistor TPS.

The second N-type transistor TNS is connected in series with the N-type semiconductor component DUTNi and the first N-type transistor TNE between the ground voltage VSS and the tracking node NTR, and the second N-type transistor NTS operates in response to a corresponding decoded bit signal DECi. The second P-type transistor TPS is connected in series with the P-type semiconductor component DUTPi and the first P-type transistor TPE between the power supply voltage VDD and the tracking node TNR, and the second P-type transistor TPS operates in response to an inversion signal DECiB of the coding decoded bit signal DECi.

As described above, only one decoded bit signal DECi corresponding to the device DUTi under test may be selectively activated from among the plurality of decoded bit signals DEC1~DECm, and the leakage voltage signal SLV may be generated using the selected device DUTi under test.

The N-type semiconductor component DUTNi and the P-type semiconductor component DUTNP in FIG. 19 are objects of the leakage current measurement. Although FIG. 19 illustrates that the N-type semiconductor component DUTNi includes one N-type transistor TNT and the P-type semiconductor component DUTPi includes one P-type transistor TPT, configurations of the N-type semiconductor component DUTNi and the P-type semiconductor component DUTPi may be determined variously.

The N-type semiconductor component DUTNi and the P-type semiconductor component DUTPi may be implemented to have different leakage characteristics with respect to the plurality of device DUT1~DUTm under test. The different leakage characteristics may be realized through different threshold voltages and/or sizes of transistors included in the semiconductor components to be objects of the leakage current measurement.

As such, the leakage current measurement circuit according to one or more example embodiments may reduce an occupation area of circuitry for leakage current measurement by sharing one detection circuit with respect to various semiconductor components having different leakage characteristics.

Figure 20:
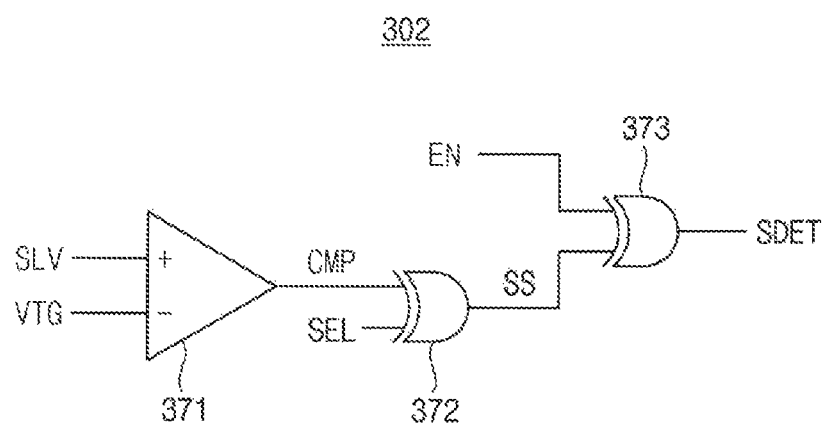
FIG. 20 is a circuit diagram illustrating a detection circuit included in the leakage current measurement circuit of FIG. 1 according to one or more example embodiments.

FIG. 20 is a circuit diagram illustrating a detection circuit included in the leakage current measurement circuit of FIG. 1 according to one or more example embodiments.

Referring to FIG. 20, a detection circuit 302 may include a comparator 371, a first XOR gate 372 and a second XOR gate 373.

The comparator 371 compares the voltage level of the leakage voltage signal SLV with the target voltage VTG to generate a comparison signal CMP. The first XOR gate 372 performs an XOR operation on the comparison signal CMP and the selection signal SEL to generates an intermediate signal SS. The second XOR gate 373 performs an XOR operation on the intermediate signal SS and the enable signal EN to generate the detection signal SDET. As such, the detection circuit 302 may generate the detection signal SDET based on the comparison signal CMP, that is, the result of comparison of the leakage voltage signal SLV and the target voltage VTG.

Hereinafter, the first operation mode MDN and the second operation mode MDP of a leakage current measurement circuit including the detection circuit 302 of FIG. 20 will be described with reference to FIGS. 21 and 22.

Figure 21:
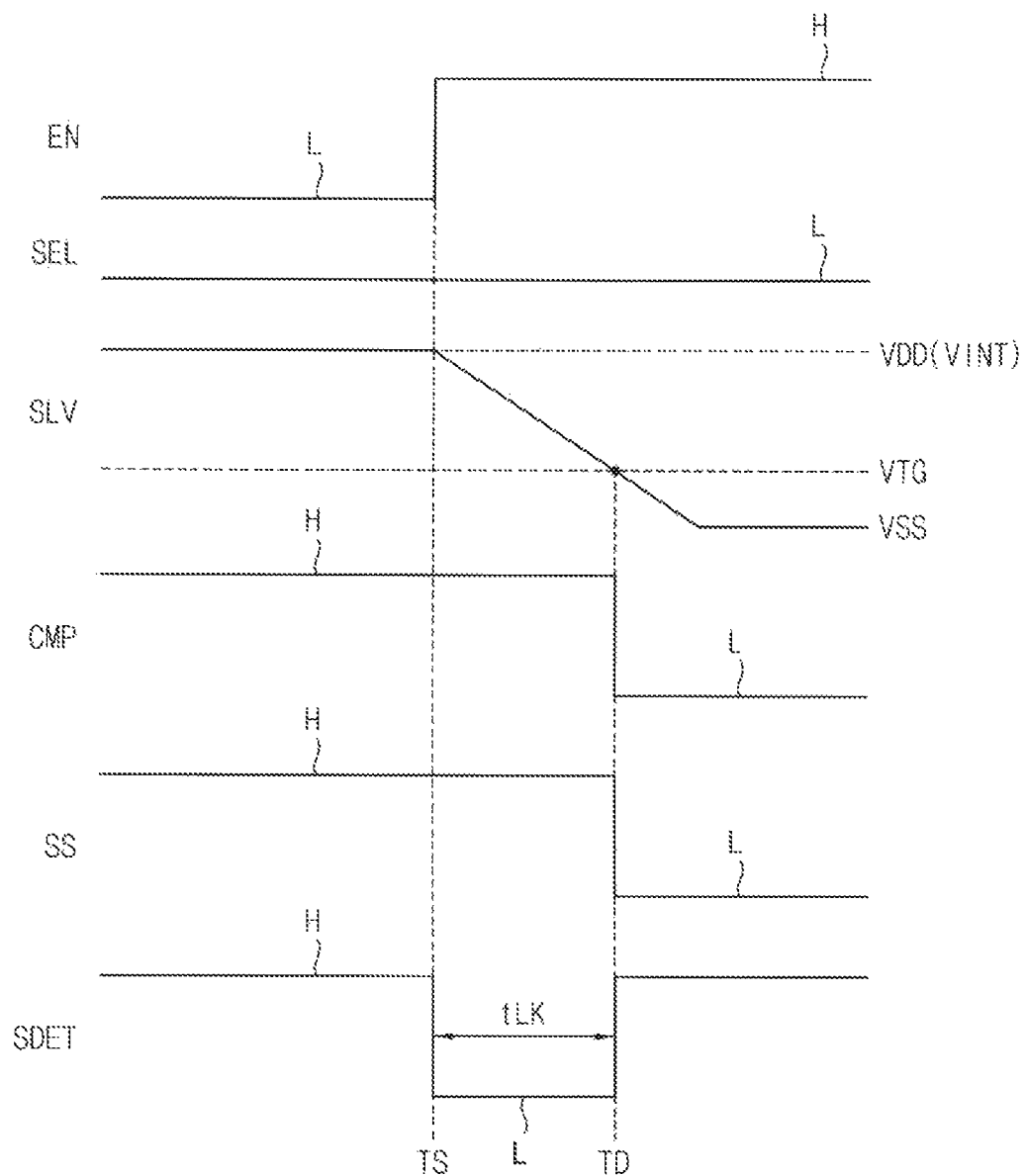
FIG. 21 is a timing diagram illustrating a first operation mode of a leakage current measurement circuit including the detection circuit of FIG. 20 according to one or more example embodiments.

FIG. 21 is a timing diagram illustrating a first operation mode of a leakage current measurement circuit including the detection circuit of FIG. 20 according to one or more example embodiments.

Referring to FIGS. 20 and 21, in the first operation mode MDN, the selection signal SEL may be fixed to the logic low level L and the enable signal EN may transition from the logic low level L to the logic high level H to indicate the start time point TS.

At the detection time point TD, the decreasing voltage level of the leakage voltage signal SLV becomes lower than the target voltage VTG, the comparison signal CMP transitions to the logic low level L and the intermediate signal SS transitions to the logic low level L.

Accordingly the detection signal SDET may be activated in the logic low level L during the activation time tLK between the start time point TS and the detection time point TD.

Figure 22:
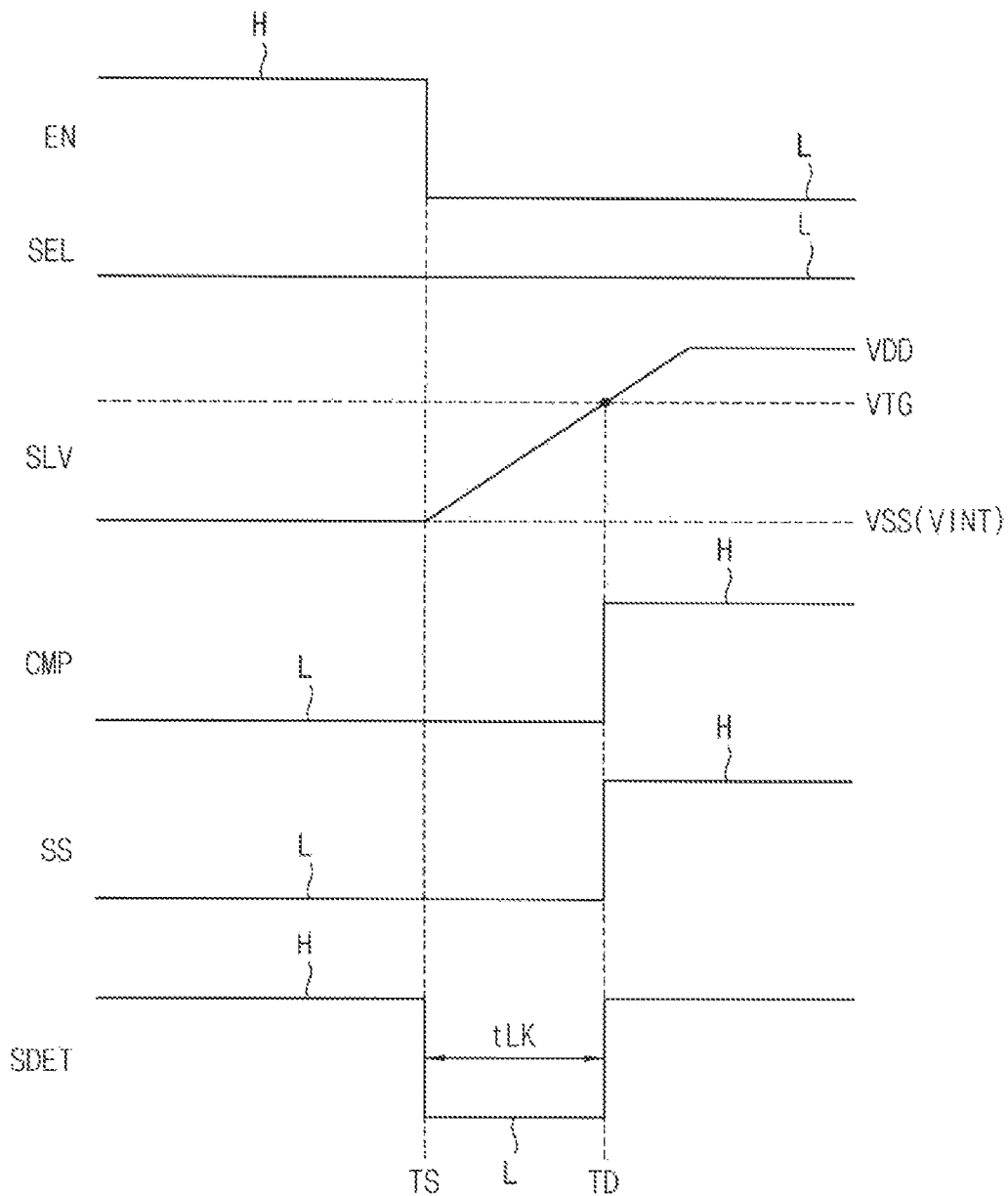
FIG. 22 is a timing diagram illustrating a second operation mode of a leakage current measurement circuit including the detection circuit of FIG. 20 according to one or more example embodiments.

FIG. 22 is a timing diagram illustrating a second operation mode of a leakage current measurement circuit including the detection circuit of FIG. 20 according to one or more example embodiments.

Referring to FIGS. 20 and 22, in the second operation mode MDP, the selection signal SEL may be fixed to the logic high level H and the enable signal EN may transition from the logic high level H to the logic low level L to indicate the start time point TS.

At the detection time point TD, the increasing voltage level of the leakage voltage signal SLV becomes higher than the target voltage VTG, the comparison signal CMP transitions to the logic high level H and the intermediate signal SS transitions to the logic high level H.

Accordingly, the detection signal SDET may be activated in the logic low level L during the activation time tLK between the start time point TS and the detection time point TD.

Figure 23:
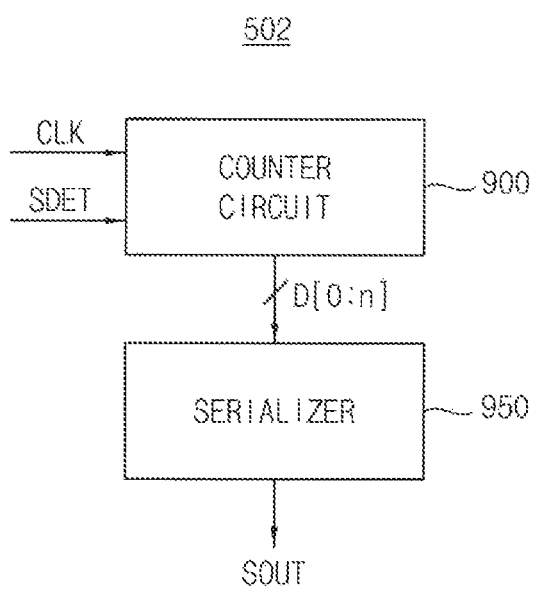
FIG. 23 is a block diagram illustrating a conversion circuit included in the leakage current measurement circuit of FIG. 1 according to one or more example embodiments.

FIG. 23 is a block diagram illustrating a conversion circuit included in the leakage current measurement circuit of FIG. 1 according to one or more example embodiments.

Referring to FIG. 23, a conversion circuit 502 may include a counter circuit 900 and a serializer 950.

The counter circuit 900 may count clock number of a clock signal CLK during the activation time tLK of the detection signal SDET to generate a count value D[0:n] corresponding to the activation time tLK of the detection signal SDET. The count value D[0:n] may be parallel signals of multiple bit signals D[0]~D[n].

The serializer 950 may serialize the count value D[0:n] to provide a digital serial signal as the output signal SOUT. According to one or more example embodiments, the serializer 950 may be omitted and the count value D[0:n] corresponding to the parallel signals may be provided as the output signal SOUT.

Figure 24:
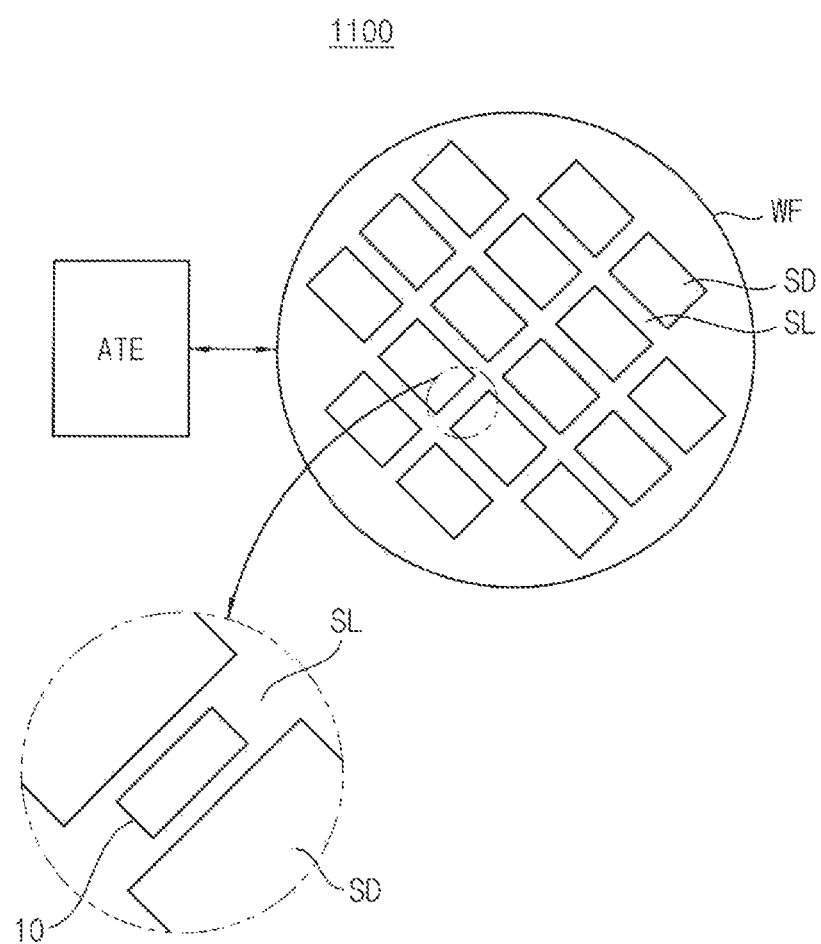
FIG. 24 is a diagram illustrating a test system according to one or more example embodiments.

FIG. 24 is a diagram illustrating a test system according to one or more example embodiments.

Referring to FIG. 24, a test system 1100 may include a semiconductor wafer WF and a test device ATE to test the semiconductor wafer WF. The semiconductor wafer WF may include a plurality of semiconductor dies SD and a leakage current measurement circuit 10 that is formed at a scribe lane SL for separating the plurality of semiconductor dies SD. As described above, the leakage current measurement circuit 10 may include a leakage generation circuit configured to generate a leakage current internally from a start time point and generate a leakage voltage signal having a voltage level that increases or decreases from an initial voltage depending on the leakage current and a detection circuit configured to generate a detection signal having an activation time from the start time point to a detection time point at which the voltage level of the leakage voltage signal reaches a target voltage. In addition, as described above, the leakage current measurement circuit 10 may further include a conversion circuit configured to generate an oscillation signal having a frequency corresponding to the activation time of the detection signal or a digital serial signal having a count value corresponding to the activation time of the detection signal. The oscillation signal or the digital serial signal may be provided to the external test device ATE through an digital input-output pad distinct from a DC measurement pad.

The plurality of semiconductor dies SD may be formed through a fabrication process, and the plurality of semiconductor dies SD may be separated along the scribe lane SL. The separated semiconductor dies are packaged into respective chips through an assembly process.

A test process such as an electric die sorting (EDS) process is performed before the assembly process to test electric characteristics of the semiconductor components formed in each semiconductor die. In the EDS process, test operation signals are applied to the semiconductor dies SD formed on the semiconductor wafer WF and performance or failure of each semiconductor die SD is determined based on test result signals from the semiconductor die SD. For example, the test device ATE may transfer the test operation signal to the semiconductor dies through a probe card and receive the test result signals from the semiconductor dies SD through the probe card.

As manufacturing processes develop, sizes of semiconductor device are decreasing and the number of semiconductor dies on each wafer is increasing. The number of the probe cards of the test device is limited and the test time for testing all of the semiconductor dies on the wafer is increased.

As a semiconductor integrated circuit is scaled down, importance of leakage of semiconductor components is increased. If the leakage measurement circuitry is integrated in the semiconductor die, an additional DC measurement pad may be required to measure the leakage current, and thus it is difficult to implement the leakage measurement circuitry in the semiconductor die. According to one or more example embodiments, as illustrated in FIG. 24, the leakage current measurement circuit 10 may be formed within the scribe lane and the leakage current may be measured based on the leakage current measurement circuit 10 for monitoring the manufacturing process.

Figure 25:
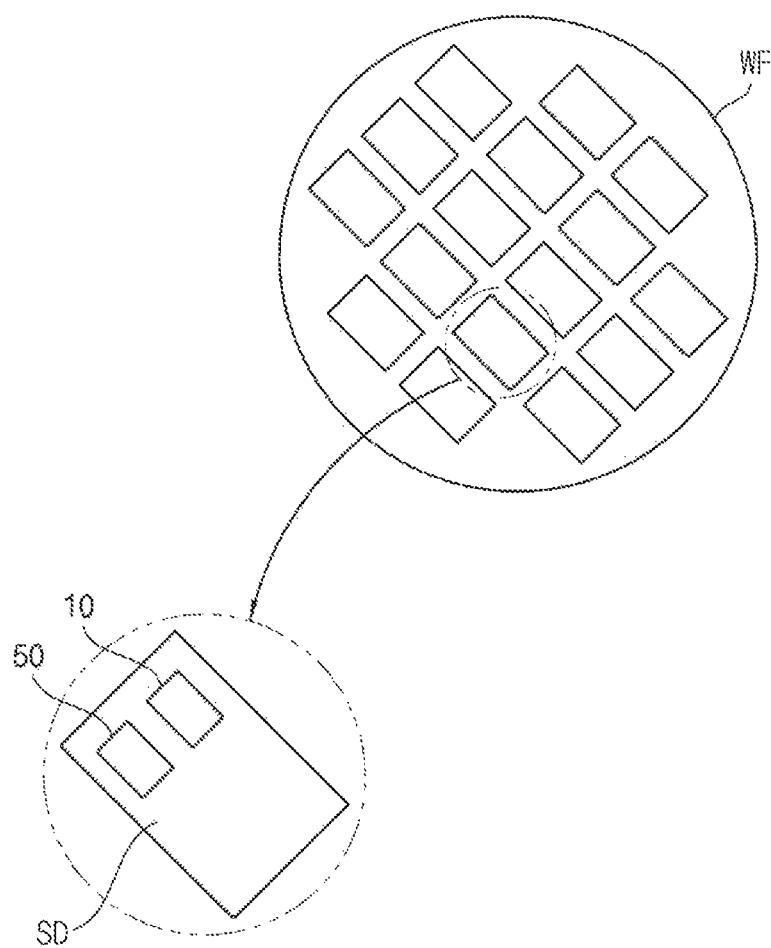
FIG. 25 is a diagram illustrating an integrated circuit according to one or more example embodiments.

FIG. 25 is a diagram illustrating an integrated circuit according to one or more example embodiments.

Referring to FIG. 25, an integrated circuit of each semiconductor die SD may include a leakage current measurement circuit 10 and a monitoring circuit 50, and other circuits for its own functions are omitted in FIG. 25. The leakage current measurement circuit 10 may measure the leakage current and the monitoring circuit 50 may monitor operation status of the integrated circuit based on the measured leakage current. As described above, the leakage current measurement circuit 10 may include a leakage generation circuit configured to generate a leakage current internally from a start time point and generate a leakage voltage signal having a voltage level that increases or decreases from an initial voltage depending on the leakage current and a detection circuit configured to generate a detection signal having an activation time from the start time point to a detection time point at which the voltage level of the leakage voltage signal reaches a target voltage.

When the leakage current measurement circuit 10 is included in the integrated circuit of semiconductor die SD, the leakage current may be measured and used to monitor the operation of the integrated circuit during the normal operation of the integrated circuit in addition to during the test operation.

Figure 26:
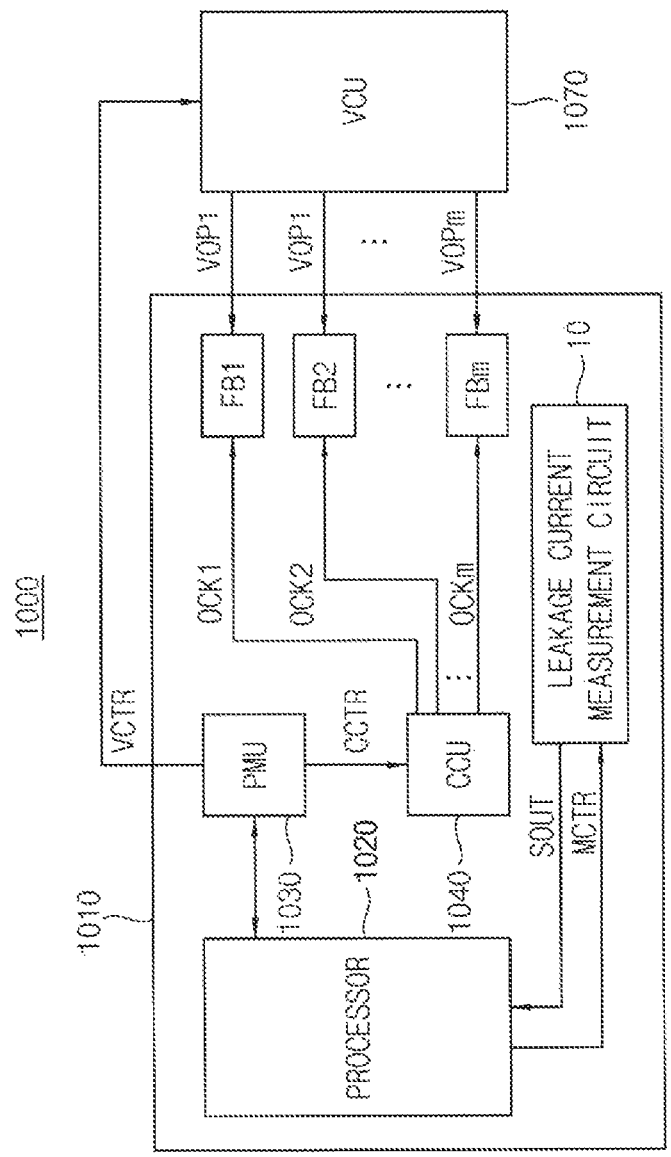
FIG. 26 is a block diagram illustrating a system according to one or more example embodiments.

FIG. 26 is a block diagram illustrating a system according to one or more example embodiments.

Referring to FIG. 26, a system 1000 may include an integrated circuit 1010 and a voltage control unit (VCU) 1070 (e.g., voltage controller). FIG. 26 illustrates an example that a leakage current measurement circuit is implemented as an on-chip configuration.

The integrated circuit 1010 may include at least one processor 1020, a power management unit (PMU) 1030 (e.g., power manager), a clock control unit (CCU) 1040 (e.g., clock controller), one or more function blocks FB1~FBm and a leakage current measurement circuit 10.

The integrated circuit 1010 may be a system on chip (SoC) in which various elements or components are integrated as one chip. The integrated circuit 1010 may be powered by the voltage control unit 1070. The voltage control unit 1070 may include at least one voltage regulator. The voltage control unit 1070 may be referred to as a power supply or a power management integrated circuit (PMIC). According to one or more example embodiments, the voltage control unit 1070 may be implemented as another chip distinct from the chip of the integrated circuit 1010, or at least a portion of the voltage control unit 1070 may be included in the integrated circuit 1010.

Even though one processor 1020 is illustrated in FIG. 26, the integrated circuit 1010 may further include one or more processors or processing units. The processor 1020 may be a central processing unit (CPU) for performing main functions of the integrated circuit 1010. The processor 1020 may be configured to perform program instructions, such as those of an operating system (OS).

The power management unit 1030 may monitor the operating status or the operating condition of the integrated circuit 1010 to determine an operating power level corresponding to the present operating condition. The power level may be represented by at least one of the operating voltage and the operating frequency. In other words, the power level may be changed by changing at least one of the operating voltage and the operating frequency. The operating voltage may be the power supply voltage and the operating frequency may be the frequency of the operating clock signal.

The power management unit 1030 may monitor the operating status or the operating condition, such as the workload, the operating temperature, etc., of the integrated circuit 1010 to determine the operating power level corresponding to the present operating condition. For example, when the workload of the integrated circuit 1010 increases, the power management unit 1030 may raise the operating power level to increase the operating voltage and/or the operating frequency. In contrast, when the workload of the integrated circuit 1010 decreases, the power management unit 1030 may lower the operating power level to decrease the operating voltage and/or the operating frequency.

The power management unit 1030 may generate a voltage control signal VCTR and a clock control signal CCTR, and the voltage control unit 1070 and the clock control unit 1040 may provide the operating voltage and the operating frequency corresponding to the determined operating power level in response to the generated voltage control signal VCTR and the generated clock control signal CCTR, respectively. The operating power level may be altered by changing at least one of the operating voltage and the operating frequency. In example embodiments, the power management unit 1030 may control the power level of a portion of the integrated circuit 1010 independently of the power level of another portion of the integrated circuit 1010. For example, when the function blocks FB1~FBm are included in different power domains, the operating voltages VOP1~VOPm provided to the function blocks FB1~FBm may be controlled independently. In addition, when the function blocks FB1~FBm are included in different clock domains, the operating clock signals OCK1~OCKm provided to the function blocks FB1~FBm may be controlled independently.

The function blocks FB1~FBm may perform predetermined functions and the function blocks may be referred to as intellectual property cores or IP cores. For example, the function blocks FB1~FBm may include a memory controller, a central processing unit (CPU), a display controller, a file system block, a graphic processing unit (GPU), an image signal processor (ISP), a multi-format codec block (MFC), etc. The processor 1020 and the power management unit 1030 may be the independent function blocks, respectively.

The clock control unit 1040 may generate the operating clock signals that are provided to the function blocks FB1~FBm, respectively. The clock control unit 1040 may include at least one of a phase-locked loop (PLL), a delay-locked loop (DLL), a clock multiplier, and a clock diver.

As described above, the leakage current measurement circuit 10 may include a leakage generation circuit and a detection circuit. The leakage generation circuit may generate a leakage current internally from a start time point TS and generate a leakage voltage signal SLV having a voltage level that increases or decreases from an initial voltage VINT depending on the leakage current. The detection circuit may generate a detection signal SDET having an activation time tLK from the start time point TS to a detection time point TD at which the voltage level of the leakage voltage signal SLV reaches a target voltage VTG. The detection signal SDET may be provided as an output signal SOUT. The leakage current measurement circuit 10 may be controlled by a control signal MCTR from the processor 1020.

In some example embodiments, the output signal SOUT of the leakage current measurement circuit 10 may be provided to the processor 1020 to control the operation of the system 1000. In other example embodiments, the output signal SOUT of the leakage current measurement circuit 10 may be provided to an external device such as a test device.

As described above, the leakage current measurement circuit according to one or more example embodiments may reduce a test time for leakage current measurement using temporal information of one-time charge or discharge. In addition, an occupation area of circuitry for leakage current measurement may be reduced by sharing one detection circuit with respect to various semiconductor components having different leakage characteristics. Further the leakage current measurement circuit may be adaptable efficiently to a system having limited input-output pads by converting and providing the information on the leakage current as a frequency of an oscillation signal or a single digital serial signal.

The present inventive concept may be applied to any integrated circuit and systems requiring the leakage current measurement. For example, the present inventive concept may be applied to systems such as be a memory card, a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A leakage current measurement circuit comprising:
   a leakage generation circuit configured to generate, based on an enable signal, a leakage current from a start time point and generate a leakage voltage signal having a voltage level that changes from an initial voltage based on the leakage current; and
   a detection circuit configured to generate a detection signal having an activation time, the detection signal being generated from the start time point to a detection time point, and the detection time point corresponding to when the voltage level of the leakage voltage signal reaches a target voltage,
   wherein the leakage current measurement circuit is configured to:
      operate in a first operation mode for measuring an N-type semiconductor component leakage current based on a selection signal indicating the first operation mode; and
      operate in a second operation mode for measuring a P-type semiconductor component leakage current based on the selection signal indicating the second operation mode.

2. The leakage current measurement circuit of claim 1, wherein the activation time of the detection signal decreases as the leakage current increases.

3. The leakage current measurement circuit of claim 1, wherein the leakage generation circuit is further configured to:
   generate the leakage voltage signal such that the leakage voltage signal decreases from the initial voltage to the target voltage and then to a ground voltage in the first operation mode, and
   generate the leakage voltage signal such that the leakage voltage signal increases from the initial voltage to the target voltage and then to a power supply voltage in the second operation mode.

4. The leakage current measurement circuit of claim 1, wherein the leakage generation circuit is further configured to:
   charge, in the first operation mode, a tracking node with a power supply voltage and generate the leakage current through an N-type semiconductor component from the start time point to discharge the tracking node, the leakage voltage signal being provided at the tracking node, and
   discharge, in the second operation mode, the tracking node with a ground voltage and generate the leakage current through a P-type semiconductor component from the start time point to charge the tracking node.

5. A leakage current measurement circuit comprising:
   a leakage generation circuit configured to generate a leakage current from a start time point and generate a leakage voltage signal having a voltage level that changes from an initial voltage based on the leakage current; and
   a detection circuit configured to generate a detection signal having an activation time, the detection signal being generated from the start time point to a detection time point, and the detection time point corresponding to when the voltage level of the leakage voltage signal reaches a target voltage,
   wherein the leakage generation circuit includes:
      an N-type semiconductor component connected between a ground voltage and a tracking node, the N-type semiconductor component being configured to operate based on a selection signal, and the leakage voltage signal being provided at the tracking node;
      an N-type transistor connected in series with the N-type semiconductor component between the ground voltage and the tracking node, the N-type transistor being configured to operate based on an enable signal;
      a P-type semiconductor component connected between a power supply voltage and the tracking node, the P-type semiconductor component being configured to operate based on the selection signal; and
      a P-type transistor connected in series with the P-type semiconductor component between the power supply voltage and the tracking node, the P-type transistor being configured to operate based on the enable signal.

6. The leakage current measurement circuit of claim 5, wherein the start time point corresponds to a transition time point of the enable signal, and
   wherein the leakage generation circuit is further configured to selectively generate the leakage current through the N-type semiconductor component and the P-type semiconductor component based on a logic level of the selection signal.

7. The leakage current measurement circuit of claim 1, wherein the leakage generation circuit includes a plurality of devices under test commonly connected to a tracking node that provides the leakage voltage signal, each of the plurality of devices under test having different leakage characteristics.

8. The leakage current measurement circuit of claim 7, further comprising a decoder configured to generate a plurality of decoded bit signals based on a selection code and provide the plurality of decoded bit signals to the plurality of devices under test, respectively,
   wherein the leakage generation circuit is further configured to select a device under test from among the plurality of devices under test based on the plurality of decoded bit signals and generate the leakage voltage signal using the device under test.

9. The leakage current measurement circuit of claim 7, wherein each of the plurality of devices under test includes:
   an N-type semiconductor component connected between a ground voltage and the tracking node, the N-type semiconductor component being configured to operate based on the selection signal, the leakage voltage signal being provided at the tracking node;
   a first N-type transistor connected in series with the N-type semiconductor component between the ground voltage and the tracking node, the first N-type transistor being configured to operate based on the enable signal;
   a second N-type transistor connected in series with the N-type semiconductor component and the first N-type transistor between the ground voltage and the tracking node, the second N-type transistor being configured to operate based on a corresponding decoded bit signal;

a P-type semiconductor component connected between a power supply voltage and the tracking node, the P-type semiconductor component being configured to operate based on the selection signal;

a first P-type transistor connected in series with the P-type semiconductor component between the power supply voltage and the tracking node, the first P-type transistor being configured to operate based on the enable signal; and a second P-type transistor connected in series with the P-type semiconductor component and the first P-type transistor between the power supply voltage and the tracking node, the second P-type transistor being configured to operate based on an inversion signal of the corresponding decoded bit signal.

10. The leakage current measurement circuit of claim 1, wherein the detection circuit includes a detection inverter configured to operate based on the leakage voltage signal, wherein the target voltage corresponds to the leakage voltage signal when an output signal of the detection inverter transitions.

11. The leakage current measurement circuit of claim 1, wherein the detection circuit includes:

a detection inverter having an input terminal connected to a tracking node and an output node connected to a first node, the leakage voltage signal being provided at the tracking node;

a transfer circuit configured to electrically connect the first node to a second node from the start time point;

a reset circuit configured to reset a voltage at the second node before the start time point; and an output driving circuit configured to generate the detection signal based on the voltage at the second node.

12. The leakage current measurement circuit of claim 1, further comprising a conversion circuit configured to generate an oscillation signal having a frequency corresponding to the activation time of the detection signal based on the detection signal.

13. The leakage current measurement circuit of claim 12, wherein the activation time of the detection signal decreases as the leakage current increases and the frequency of the oscillation signal increases as the activation time of the detection signal decreases.

14. The leakage current measurement circuit of claim 12, wherein the conversion circuit includes:

a time-voltage converter configured to provide a control voltage corresponding to the activation time of the detection signal based on the detection signal; and a voltage-controlled oscillator configured to generate the oscillation signal having the frequency corresponding to the activation time of the detection signal based on the control voltage.

15. The leakage current measurement circuit of claim 14, wherein the time-voltage converter includes:

a storage capacitor connected to a storage node configured to provide the control voltage;

a charging switch configured to reset a voltage at the storage node before the start time point; and a diode configured to discharge the voltage at the storage node during the activation time of the detection signal.

16. The leakage current measurement circuit of claim 1, wherein the detection circuit includes a comparator configured to generate a comparison signal by comparing the voltage level of the leakage voltage signal with the target voltage, wherein the detection circuit is further configured to generate the detection signal based on the comparison signal.

17. An integrated circuit formed in a semiconductor die, the integrated circuit comprising:

a leakage current measurement circuit configured to measure a leakage current of the semiconductor die; and a monitoring circuit configured to monitor an operation of the integrated circuit based on an output of the leakage current measurement circuit, wherein the leakage current measurement circuit comprises:

a leakage generation circuit configured to generate, based on an enable signal, the leakage current from a start time point and generate a leakage voltage signal having a voltage level that changes from an initial voltage based on the leakage current; and a detection circuit configured to generate a detection signal having an activation time, the detection signal being generated from the start time point to a detection time point, and the detection time point corresponding to when the voltage level of the leakage voltage signal reaches a target voltage, and wherein the leakage current measurement circuit is configured to:

operate in a first operation mode for measuring an N-type semiconductor component leakage current based on a selection signal indicating the first operation mode; and operate in a second operation mode for measuring a P-type semiconductor component leakage current based on the selection signal indicating the second operation mode.

18. The leakage current measurement circuit of claim 1, wherein the start time point corresponds to a transition time point of the enable signal.

19. The leakage current measurement circuit of claim 1, wherein the leakage current measurement circuit is formed at a scribe lane of a semiconductor wafer, the scribe lane being for separating a plurality of semiconductor dies included in the semiconductor wafer.

* * * * *